US010290769B2

(12) United States Patent
Lee et al.

(10) Patent No.: US 10,290,769 B2
(45) Date of Patent: May 14, 2019

(54) VERTICAL TYPE LIGHT EMITTING DIODE HAVING GROOVE DISPOSED UNDER THE FIRST CONDUCTIVITY TYPE SEMICONDUCTOR LAYER

(71) Applicant: SEOUL VIOSYS CO., LTD., Ansan-si (KR)

(72) Inventors: Mi Hee Lee, Ansan-si (KR); Chang Yeon Kim, Ansan-si (KR); Ju Yong Park, Ansan-si (KR); Jong Kyun You, Ansan-si (KR); Joon Hee Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/872,900

(22) Filed: Jan. 16, 2018

(65) Prior Publication Data

US 2019/0044027 A1    Feb. 7, 2019

(30) Foreign Application Priority Data

Jan. 16, 2017 (KR) .................. 10-2017-0007138
Nov. 1, 2017 (KR) .................. 10-2017-0144872
Jan. 15, 2018 (KR) .................. 10-2018-0004980

(51) Int. Cl.
*H01L 27/32* (2006.01)
*H01L 33/20* (2010.01)
*H01L 33/32* (2010.01)
*H01L 33/10* (2010.01)

(52) U.S. Cl.
CPC .............. *H01L 33/20* (2013.01); *H01L 33/10* (2013.01); *H01L 33/32* (2013.01)

(58) Field of Classification Search
CPC ....... H01L 27/32; H01L 31/143; H01L 3/162; H01L 51/50
See application file for complete search history.

(56) References Cited

U.S. PATENT DOCUMENTS

2012/0276668 A1* 11/2012 Muramoto .......... H01L 33/0095
438/28

\* cited by examiner

*Primary Examiner* — Hoai V Pham
(74) *Attorney, Agent, or Firm* — Perkins Coie LLP

(57) ABSTRACT

A light emitting diode includes: a first conductivity type semiconductor layer; a mesa including an active layer and a second conductivity type semiconductor layer, the mesa having a groove disposed under some region of the first conductivity type semiconductor layer to expose an edge of the first conductivity type semiconductor layer, the groove exposing the first conductivity type semiconductor layer; a first electrode including a first contact portion electrically connected to the first conductivity type semiconductor layer through the groove; a second electrode disposed between the first electrode and the second conductivity type semiconductor layer and electrically connected to the second conductivity type semiconductor layer; and an upper electrode pad disposed adjacent to the first conductivity type semiconductor layer and connected to the second electrode, wherein the groove has a shape surrounding a region including a center of the mesa and partially open.

21 Claims, 25 Drawing Sheets

FIG. 18A
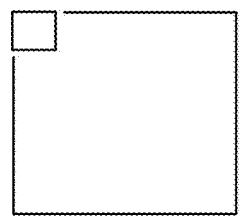
FIG. 18B
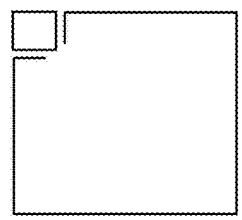
FIG. 18C
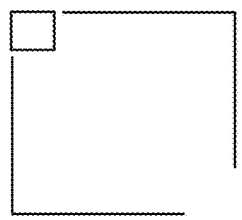
FIG. 18D
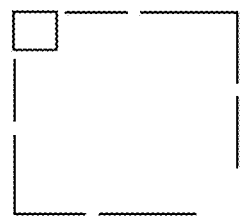
FIG. 19A
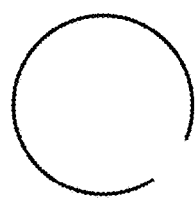
FIG. 19B
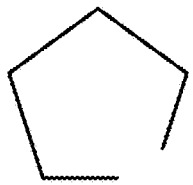
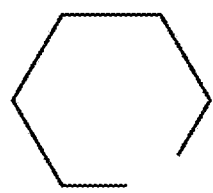
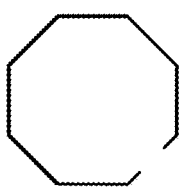
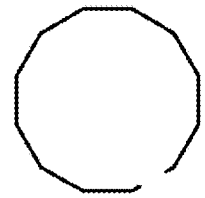
FIG. 19C
FIG. 19D
FIG. 19E

VERTICAL TYPE LIGHT EMITTING DIODE HAVING GROOVE DISPOSED UNDER THE FIRST CONDUCTIVITY TYPE SEMICONDUCTOR LAYER

CROSS-REFERENCE TO RELATED APPLICATION(S)

This patent document claims priority to and the benefit of Korean Patent Application No. 10-2017-0007138, filed on Jan. 16, 2017, Korean Patent Application No. 10-2017-0144872 filed on Nov. 1, 2017, and Korean Patent Application No. 10-2018-0004980 filed on Jan. 15, 2018, which are incorporated herein by reference for all purposes as if fully set forth herein.

TECHNICAL FIELD

Exemplary embodiments of the present disclosure relate to a light emitting diode and, more particularly, to a vertical type light emitting diode having improved current spreading performance and high reliability.

BACKGROUND

Generally, group III-based nitride semiconductors, such as gallium nitride (GaN) and aluminum nitride (AlN), have good thermal stability and a direct transition type energy band structure, and thus have been spotlighted as materials for light emitting devices emitting light in the visible range and in the UV range.

Such group III-based nitride semiconductor layers are grown on a heterogeneous substrate having a similar crystal structure through metal organic chemical vapor deposition (MOCVD) or molecular beam epitaxy (MBE) due to difficulty in fabrication of a homogeneous substrate capable of growing the group III-based nitride semiconductor layers. As the heterogeneous substrate, a sapphire substrate having a hexagonal crystal structure is generally used. However, since sapphire is an electrically non-conductive material, sapphire restricts the structure of a light emitting diode. Accordingly, there have been developed a technique for manufacturing a high efficiency vertical type light emitting diode, in which epitaxial layers such as nitride semiconductor layers are grown on a heterogeneous substrate, such as a sapphire substrate, and a support substrate is bonded to the epitaxial layers, followed by separating the heterogeneous substrate through laser lift-off or the like.

Generally, a vertical type light emitting diode has better current spreading performance than a typical lateral type light emitting diode and exhibits good heat dissipation performance through adoption of a support substrate having higher thermal conductivity than sapphire. Furthermore, a reflective metal layer can be disposed between the support substrate and the semiconductor layers to reflect light traveling towards the support substrate, thereby improving light extraction efficiency.

Further, the vertical type light emitting diode can improve light extraction efficiency through a roughened surface of an epitaxial layer (n-type semiconductor layer) through which light is emitted. To this end, the epitaxial layers are subjected to wet etching such as photo-enhanced chemical (PEC) etching. However, since wet etching can provide damage to a bonding metal layer or a reflective metal layer, there is a need for protection of the bonding metal layer or the reflective metal layer from an etchant.

The vertical type light emitting diode generally employs a conductive support substrate and includes an anode pad on the support substrate and a cathode pad on the epitaxial layers. Furthermore, an electrode extension extending from the cathode pad and electrically contacting the epitaxial layers is used to assist in current spreading within the epitaxial layers. The electrode extension may be formed not only in a central region of the light emitting diode but also near edges of the epitaxial layers to evenly distribute the current over a large area of the epitaxial layers. However, since the cathode pad and the electrode extension are disposed on an epitaxial layer through which light is emitted, light emission is blocked by the cathode pad and the electrode extension, thereby deteriorating luminous efficacy of the light emitting diode.

SUMMARY

Exemplary embodiments of the present disclosure provide a vertical type light emitting diode having a new structure capable of achieving more uniform current spreading over a large area.

Exemplary embodiments of the present disclosure provide a vertical type light emitting diode that can be manufactured through an efficient manufacturing process to reduce process cost and time.

Exemplary embodiments of the present disclosure provide a vertical type light emitting diode that can secure good current spreading while preventing light loss by a cathode pad.

Exemplary embodiments of the present disclosure provide a vertical type light emitting diode that can prevent damage to each layer in the light emitting diode during a manufacturing process such as wet etching, thereby securing improved production yield.

In accordance with one exemplary embodiment of the present disclosure, a light emitting diode includes: a support substrate; a first conductivity type semiconductor layer disposed on the support substrate; a mesa including an active layer and a second conductivity type semiconductor layer, the mesa having a groove disposed under some region of the first conductivity type semiconductor layer to expose an edge of the first conductivity type semiconductor layer, the groove exposing the first conductivity type semiconductor layer through the second conductivity type semiconductor layer and the active layer; a first electrode disposed between the second conductivity type semiconductor layer and the support substrate and including a first contact portion electrically connected to the first conductivity type semiconductor layer around the mesa and a second contact portion electrically connected to the first conductivity type semiconductor layer through the groove; a second electrode disposed between the first electrode and the second conductivity type semiconductor layer and electrically connected to the second conductivity type semiconductor layer; and an upper electrode pad disposed adjacent to the first conductivity type semiconductor layer and connected to the second electrode, wherein the groove has a shape surrounding a region including a center of the mesa and partially open.

In accordance with another exemplary embodiment of the present disclosure, a light emitting diode includes: a support substrate; a first conductivity type semiconductor layer disposed on the support substrate; a mesa including an active layer and a second conductivity type semiconductor layer, the mesa having a groove disposed under some region of the first conductivity type semiconductor layer to expose an edge of the first conductivity type semiconductor layer, the groove exposing the first conductivity type semiconductor layer through the second conductivity type semiconductor layer and the active layer; a first electrode disposed between the second conductivity type semiconductor layer and the support substrate, the first electrode including a first contact portion electrically connected to the first conductivity type semiconductor layer around the mesa and a second contact portion electrically connected to the first conductivity type semiconductor layer through the groove; a second electrode insulated from the first electrode and electrically connected to the second conductivity type semiconductor layer; and an upper electrode pad disposed adjacent to the first conductivity type semiconductor layer and electrically connected to the second electrode, wherein the groove has a linear shape.

In accordance with a further exemplary embodiment of the present disclosure, a light emitting diode includes: a support substrate; a semiconductor stack structure disposed on the support substrate and including a first conductivity type semiconductor layer, an active layer and a second conductivity type semiconductor layer, the semiconductor stack structure having a first groove exposing the first conductivity type semiconductor layer through the second conductivity type semiconductor layer and the active layer; a first electrode disposed between the second conductivity type semiconductor layer and the support substrate and including a first contact portion electrically connected to the first conductivity type semiconductor layer through the first groove; a second electrode disposed between the first electrode and the second conductivity type semiconductor layer to be electrically connected to the second conductivity type semiconductor layer, the second electrode including an extension region disposed under the semiconductor stack structure and extending from a side surface of the semiconductor stack structure to a region outside the semiconductor stack structure; an upper electrode pad disposed adjacent to the side surface of the semiconductor stack structure and connected to the extension region of the second electrode, wherein the side surface of the semiconductor stack structure adjacent to the upper electrode pad includes a side surface of the first conductivity type semiconductor layer, a side surface of the active layer and a side surface of the second conductivity type semiconductor layer.

In accordance with yet another exemplary embodiment of the present disclosure, a light emitting diode includes: a support substrate; a semiconductor stack structure disposed on the support substrate and including a first conductivity type semiconductor layer, an active layer and a second conductivity type semiconductor layer, the semiconductor stack structure having a groove exposing the first conductivity type semiconductor layer through the second conductivity type semiconductor layer and the active layer; a first electrode disposed between the second conductivity type semiconductor layer and the support substrate and including a contact portion electrically connected to the first conductivity type semiconductor layer through the first groove; a second electrode disposed between the first electrode and the second conductivity type semiconductor layer to be electrically connected to the second conductivity type semiconductor layer, the second electrode including an extension region disposed under the semiconductor stack structure and extending from a side surface of the semiconductor stack structure to a region outside the semiconductor stack structure; and an upper electrode pad disposed adjacent to the side surface of the semiconductor stack structure and connected to the extension region of the second electrode, wherein the groove has a width and a length, the length of the groove being greater than the width of the groove, the width of the groove being smaller than a minimum width of the upper electrode pad; the side surface of the semiconductor stack structure adjacent to the upper electrode pad includes a side surface of the first conductivity type semiconductor layer, a side surface of the active layer and a side surface of the second conductivity type semiconductor layer; and the groove is separated at ends thereof from the side surface of the semiconductor stack structure adjacent to the upper electrode pad such that a distance between at least one end of the groove and the side surface of the semiconductor stack structure adjacent to the upper electrode pad is smaller than the minimum width of the upper electrode pad.

Embodiments of the present disclosure provide a vertical type light emitting diode that includes a groove formed in a mesa and having a linear shape, thereby improving current spreading performance. Further, the light emitting diode can further improve current spreading performance through a combination of a first contact portion and a second contact portion. Further, the light emitting diode includes a first electrode and a second electrode between a support substrate and semiconductor layers, thereby preventing light loss due to absorption of light by the electrodes. Furthermore, the light emitting diode includes an upper electrode pad near a semiconductor stack structure to prevent light emitted through an upper surface of the semiconductor stack structure from being blocked by the upper electrode pad, thereby improving luminous efficacy. Furthermore, the side surface of the semiconductor stack structure adjacent to the upper electrode pad includes a side surface of a first conductivity type semiconductor layer, a side surface of an active layer and a side surface of a second conductivity type semiconductor layer such that wet etching such as photo-enhanced chemical etching can be stably performed after an isolation process, thereby improving production yield of the light emitting diode.

The above and other features and advantages of the present disclosure will become apparent from the following detailed description.

BRIEF DESCRIPTION OF THE DRAWINGS

FIGS. 18A, 18B, 18C and 18D show schematic plan views of modifications of a first contact portion of the light emitting diodes according to the exemplary embodiments of the present disclosure.

FIGS. 19A to 19E show schematic plan views of modifications of a second contact portion of the light emitting diodes according to the exemplary embodiments of the present disclosure of the present disclosure.

DETAILED DESCRIPTION

Figure 1:
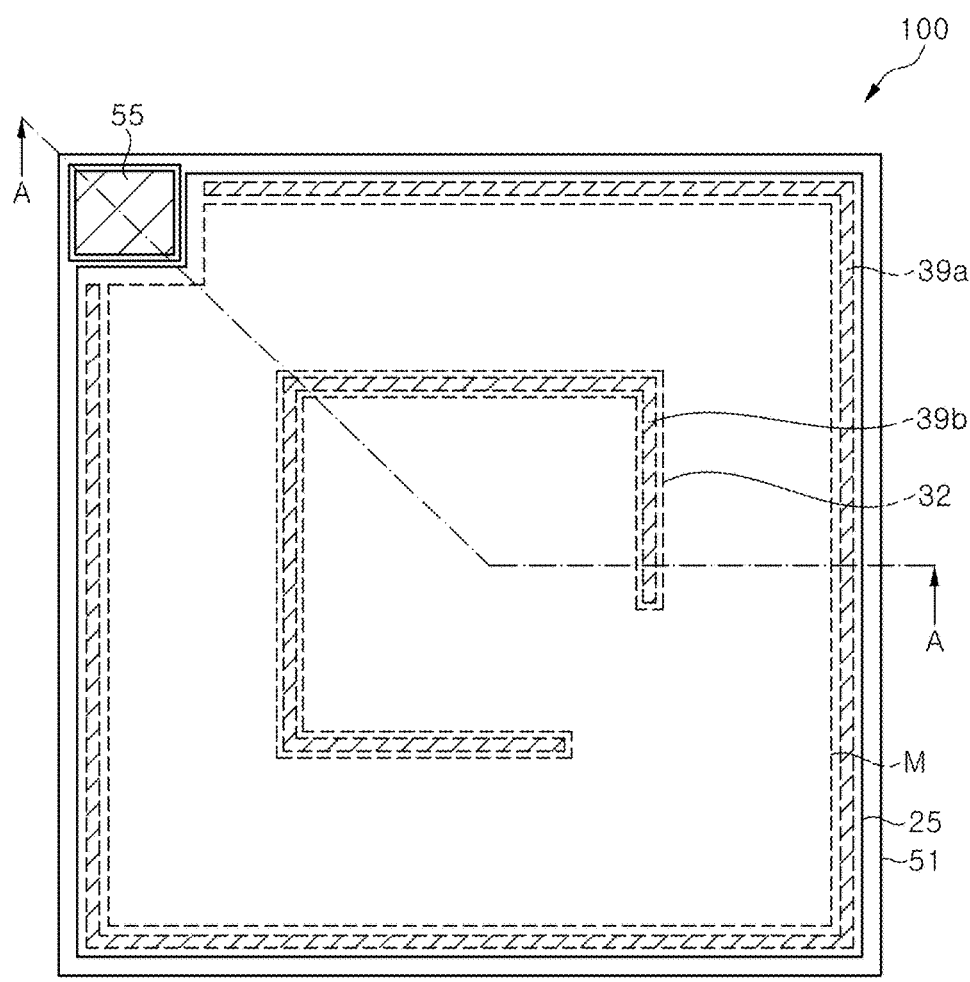
FIG. 1 is a schematic plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes.

In accordance with one exemplary embodiment of the present disclosure, a light emitting diode includes: a support substrate; a first conductivity type semiconductor layer disposed on the support substrate; a mesa including an active layer and a second conductivity type semiconductor layer, the mesa having a groove disposed under some region of the first conductivity type semiconductor layer to expose an edge of the first conductivity type semiconductor layer, the groove exposing the first conductivity type semiconductor layer through the second conductivity type semiconductor layer and the active layer; a first electrode disposed between the second conductivity type semiconductor layer and the support substrate and including a first contact portion electrically connected to the first conductivity type semiconductor layer around the mesa and a second contact portion electrically connected to the first conductivity type semiconductor layer through the groove; a second electrode disposed between the first electrode and the second conductivity type semiconductor layer and electrically connected to the second conductivity type semiconductor layer; and an upper electrode pad disposed adjacent to the first conductivity type semiconductor layer and connected to the second electrode, wherein the groove has a shape surrounding a region including a center of the mesa and partially open.

The support substrate may have a rectangular shape and the upper electrode pad may be disposed above one corner of the support substrate.

The first contact portion of the first electrode may have a shape surrounding the mesa and at least partially open near the upper electrode pad. Further, the first contact portion of the first electrode may be connected to the first conductivity type semiconductor layer in plural linear regions separated from each other.

An open portion of the groove may be disposed closer to one of other corners of the support substrate than the one corner thereof, at which the upper electrode pad is disposed, so as not to face the upper electrode pad.

The open portion of the groove may be disposed at an opposite side of the upper electrode pad.

The first contact portion may have a single open portion. Thus, the open portion of the groove and the open portion of the first contact portion may be disposed at opposite sides to face each other.

The second contact portion may be connected in the same shape as the groove to the first conductivity type semiconductor layer.

The groove may have a partially open circular shape or a partially open convex polygonal shape.

The groove may have a partially open square shape.

The light emitting diode may further include a first insulating layer insulating the first electrode from the first conductivity type semiconductor layer; and a second insulating layer interposed between the first electrode and the second electrode.

The light emitting diode may further include a reflective layer disposed between the second insulating layer and the first electrode, wherein the reflective layer may include a dispersed Bragg reflector.

The light emitting diode may further include a bonding metal layer interposed between the first electrode and the support substrate; and a first electrode-protection metal layer interposed between the bonding metal layer and the first electrode to cover the first electrode.

The second electrode may include an ohmic reflective layer forming ohmic contact with the second conductivity type semiconductor layer and a protective metal layer protecting the ohmic reflective layer.

The protective metal layer may extend outside the first conductivity type semiconductor layer and the upper electrode pad may be connected to the protective metal layer.

The light emitting diode may further include an upper insulating layer covering the first conductivity type semiconductor layer and connected to the protective metal layer through the upper insulating layer and the first insulating layer.

An elevation of a plane in which the upper electrode pad adjoins the protective metal layer may be placed between a plane of the first conductivity type semiconductor layer exposed around the mesa and a lower surface of the mesa adjoining the ohmic reflective layer.

The light emitting diode may further include an upper coating layer disposed on the first conductivity type semiconductor layer, wherein the upper coating layer may have a stacked structure of plural material layers.

The upper coating layer may include a first layer covering the first conductivity type semiconductor layer, a second layer covering the first layer and having a higher refractive index than the first layer, and a third layer covering the second layer and having a lower refractive index than the second layer. Accordingly, total reflection can occur at an interface between the second layer and the third layer.

The first layer and the third layer may include $SiO_2$ and the second layer may include $Al_2O_3$.

In accordance with another exemplary embodiment of the present disclosure, a light emitting diode includes: a support substrate; a first conductivity type semiconductor layer disposed on the support substrate; a mesa including an active layer and a second conductivity type semiconductor layer, the mesa having a groove disposed under some region of the first conductivity type semiconductor layer to expose an edge of the first conductivity type semiconductor layer, the groove exposing the first conductivity type semiconductor layer through the second conductivity type semiconductor layer and the active layer; a first electrode disposed between the second conductivity type semiconductor layer and the support substrate, the first electrode including a first contact portion electrically connected to the first conductivity type semiconductor layer around the mesa and a second contact portion electrically connected to the first conductivity type semiconductor layer through the groove; a second electrode insulated from the first electrode and electrically connected to the second conductivity type semiconductor layer; and an upper electrode pad disposed adjacent to the first conductivity type semiconductor layer and electrically connected to the second electrode, wherein the groove has a linear shape.

In some exemplary embodiments, a distance between the first contact portion and the second contact portion may be constant.

Each of the first contact portion and the groove may have an open portion such that the open portion of the first contact portion and the open portion of the groove may be disposed at opposite sides to face each other.

In accordance with a further exemplary embodiment of the present disclosure, a light emitting diode includes: a support substrate; a semiconductor stack structure disposed on the support substrate and including a first conductivity type semiconductor layer, an active layer and a second conductivity type semiconductor layer, the semiconductor stack structure having a first groove exposing the first conductivity type semiconductor layer through the second conductivity type semiconductor layer and the active layer; a first electrode disposed between the second conductivity type semiconductor layer and the support substrate and including a first contact portion electrically connected to the first conductivity type semiconductor layer through the first groove; a second electrode disposed between the first electrode and the second conductivity type semiconductor layer to be electrically connected to the second conductivity type semiconductor layer, the second electrode including an extension region disposed under the semiconductor stack structure and extending from a side surface of the semiconductor stack structure to a region outside the semiconductor stack structure; an upper electrode pad disposed adjacent to the side surface of the semiconductor stack structure and connected to the extension region of the second electrode, wherein the side surface of the semiconductor stack structure adjacent to the upper electrode pad includes a side surface of the first conductivity type semiconductor layer, a side surface of the active layer and a side surface of the second conductivity type semiconductor layer.

The first groove may have a width and a length. Here, the length of the first groove may be greater than the width of the first groove and the width of the first groove may be smaller than a minimum width of the upper electrode pad. The first groove may be separated from the side surface of the semiconductor stack structure such that a separation distance between the first groove and the semiconductor stack structure may be smaller than the minimum width of the upper electrode pad.

At least one end of the first groove may be disposed to face the side surface of the semiconductor stack structure adjacent to the upper electrode pad.

A distance between the at least one end of the groove disposed to face the side surface of the semiconductor stack structure and the side surface of the semiconductor stack structure adjacent to the upper electrode pad may be smaller than the minimum width of the upper electrode pad.

The semiconductor stack structure may be disposed in some region of the support substrate corresponding to a shape of the support substrate and have an recess near one corner of the support substrate; the upper electrode pad may be disposed near the recess; and the side surface of the semiconductor stack structure adjacent to the upper electrode pad may be an inner side of the recess.

The extension region of the second electrode may protrude from the inner side of the recess.

The light emitting diode may further include a first insulating layer interposed between the second conductivity type semiconductor layer and the second electrode, wherein the first insulating layer extends outward from the side surface of the semiconductor stack structure and the extension region of the second electrode may be disposed under the first insulating layer.

The first insulating layer may contact the second conductivity type semiconductor layer and have an opening exposing the second conductivity type semiconductor layer and an opening exposing the extension region of the second electrode; the second electrode may electrically contact the second conductivity type semiconductor layer in the opening of the first insulating layer; and the upper electrode pad may contact the extension region of the second electrode through the opening of the first insulating layer.

An extended portion of the first insulating layer extending outward from the side surface of the semiconductor stack structure may extend flush from a portion of the first insulating layer contacting the second conductivity type semiconductor layer.

The extension region of the second electrode may be disposed below the second conductivity type semiconductor layer.

The second electrode may include an ohmic reflective layer forming ohmic contact with the second conductivity type semiconductor layer and a protective metal layer covering the ohmic reflective layer, and the protective metal layer may extend outward from the semiconductor stack structure to form the extension region of the second electrode.

The first insulating layer may cover the first groove and have an opening exposing the first conductivity type semiconductor layer in the first groove and the first contact portion of the first electrode may be disposed in the opening of the first insulating layer.

The light emitting diode may further include a second insulating layer disposed between the second electrode and the first electrode and electrically insulating the first electrode from the second electrode, wherein the second insulating layer has an opening exposing the first conductivity type semiconductor layer in the first groove and the first electrode may contact the first conductivity type semiconductor layer in the first groove through the opening of the second insulating layer and the opening of the first insulating layer.

The light emitting diode may further include a reflective layer disposed between the second insulating layer and the first electrode, wherein the reflective layer may include a dispersed Bragg reflector.

The first groove may be disposed in a linear shape along an edge of the semiconductor stack structure and may have both ends near the upper electrode pad.

The first groove may include a plurality of grooves disposed along an edge of the semiconductor stack structure and separated from each other.

The semiconductor stack structure may have a second groove exposing the first conductivity type semiconductor layer through the second conductivity type semiconductor layer and the active layer; the first electrode may include a second contact portion electrically connected to the first conductivity type semiconductor layer through the second groove; and the second groove may be closer to a center of the semiconductor stack structure than the first groove.

The second groove may have a shape surrounding the semiconductor stack structure and partially open.

An open portion of the second groove may be placed at an opposite side of the upper electrode pad.

The light emitting diode may further include an upper insulating layer covering an upper surface and the side surface of the semiconductor stack structure, and the upper insulating layer covering the side surface of the semiconductor stack structure may cover the side surface of the first conductivity type semiconductor layer, the side surface of the active layer and the side surface of the second conductivity type semiconductor layer.

The light emitting diode may further include an upper coating layer disposed on the first conductivity type semiconductor layer, wherein the upper coating layer may have a stacked structure of plural material layers.

The upper coating layer may include a first layer covering the first conductivity type semiconductor layer, a second layer covering the first layer and having a higher refractive index than the first layer, and a third layer covering the second layer and having a lower index of refraction than the second layer. With this structure, total reflection of light can occur at an interface between the second layer and the third layer.

The first layer and third layer may include $SiO_2$ and the second layer may include $Al_2O_3$.

In accordance with yet another exemplary embodiment of the present disclosure, a light emitting diode includes: a support substrate; a semiconductor stack structure disposed on the support substrate and including a first conductivity type semiconductor layer, an active layer and a second conductivity type semiconductor layer, the semiconductor stack structure having a groove exposing the first conductivity type semiconductor layer through the second conductivity type semiconductor layer and the active layer; a first electrode disposed between the second conductivity type semiconductor layer and the support substrate and including a contact portion electrically connected to the first conductivity type semiconductor layer through the first groove; a second electrode disposed between the first electrode and the second conductivity type semiconductor layer to be electrically connected to the second conductivity type semiconductor layer, the second electrode including an extension region disposed under the semiconductor stack structure and extending from a side surface of the semiconductor stack structure to a region outside the semiconductor stack structure; and an upper electrode pad disposed adjacent to the side surface of the semiconductor stack structure and connected to the extension region of the second electrode, wherein the groove has a width and a length, the length of the groove being greater than the width of the groove, the width of the groove being smaller than a minimum width of the upper electrode pad; the side surface of the semiconductor stack structure adjacent to the upper electrode pad includes a side surface of the first conductivity type semiconductor layer, a side surface of the active layer and a side surface of the second conductivity type semiconductor layer; and the groove is separated at ends thereof from the side surface of the semiconductor stack structure adjacent to the upper electrode pad such that a distance between at least one end of the groove and the side surface of the semiconductor stack structure adjacent to the upper electrode pad is smaller than the minimum width of the upper electrode pad.

The groove may have a single band shape surrounding a center of the semiconductor stack structure and partially open.

Hereinafter, exemplary embodiments of the present disclosure will be described in detail with reference to the accompanying drawings.

Figure 2:
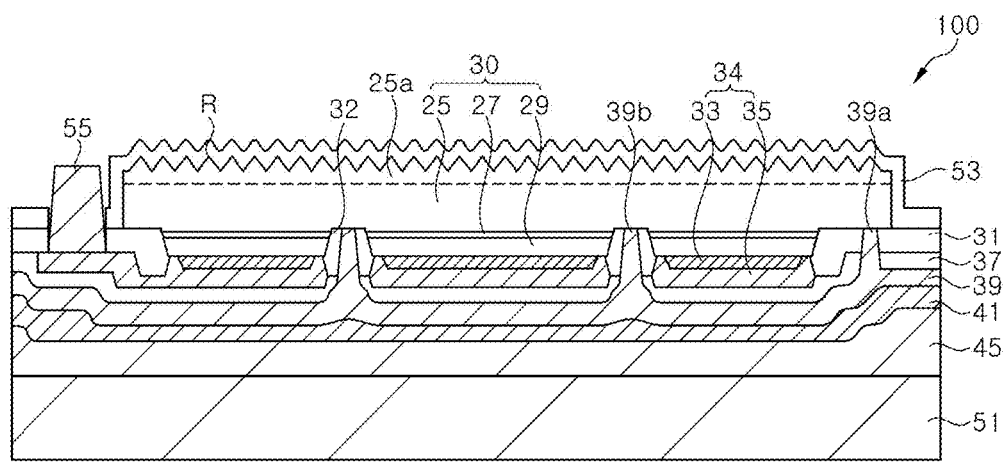
FIG. 2 is a cross-sectional view taken along line A-A of FIG. 1.

FIG. 1 is a schematic plan view of a light emitting diode according to one exemplary embodiment of the present disclosure and FIG. 2 is a cross-sectional view taken along line A-A of FIG. 1.

Referring to FIG. 1 and FIG. 2, a light emitting diode 100 according to this exemplary embodiment includes a support substrate 51, a semiconductor stack structure 30, a first insulating layer 31, a second insulating layer 37, a first electrode 39, a second electrode 34, a first electrode-protection metal layer 41, a bonding metal layer 45, an upper insulating layer 53, and an upper electrode pad 55. The semiconductor stack structure 30 may include a first conductivity type semiconductor layer 25, an active layer 27 and a second conductivity type semiconductor layer 29, and the second electrode 34 may include an ohmic reflective layer 33 and a protective metal layer 35.

The support substrate 51 is distinguished from a growth substrate for growing compound semiconductor layers and refers to a secondary substrate attached to the grown compound semiconductor layers. The support substrate 51 may be a conductive substrate such as a metal substrate or a semiconductor substrate, without being limited thereto. Alternatively, the support substrate 51 may be an insulating substrate such as a sapphire substrate. The support substrate 51 may have a substantially rectangular shape, specifically a square shape.

The semiconductor stack structure 30 is disposed on the support substrate 51 and includes the second conductivity type semiconductor layer 29, the active layer 27 and the first conductivity type semiconductor layer 25. The second conductivity type semiconductor layer 29 may be a p-type nitride semiconductor layer and the first conductivity type semiconductor layer 25 may be an n-type nitride semiconductor layer, or vice versa. The semiconductor stack structure 30 is disposed in some region of the support substrate 51. That is, the support substrate 51 has a larger area than the semiconductor stack structure 30. The semiconductor stack structure 30 is disposed in a region surrounded by an edge of the support substrate 51.

The first conductivity type semiconductor layer 25, the active layer 27 and the second conductivity type semiconductor layer 29 may be formed of III-N based compound semiconductors, for example, (Al, Ga, In)N semiconductors. Each of the first conductivity type semiconductor layer 25 and the second conductivity type semiconductor layer 29 may be composed of a single layer or multiple layers. For example, the first conductivity type semiconductor layer 25 and/or the second conductivity type semiconductor layer 29 may include a contact layer and a clad layer, and may also include a super-lattice layer. In particular, an undoped nitride semiconductor layer 25a, for example, an undoped GaN layer, may be disposed on an upper surface of the first conductivity type semiconductor layer 25. In addition, a roughened surface R may be formed on the upper surface of the first conductivity type semiconductor layer 25, for example, on an upper surface of the undoped nitride semiconductor layer 25a. On the other hand, the active layer 27 may have a single quantum well structure or a multi-quantum well structure.

The semiconductor stack structure 30 may include a mesa M disposed under the first conductivity type semiconductor layer 25. The mesa M includes the second conductivity type semiconductor layer 29 and the active layer 27 and is disposed under some region of the first conductivity type semiconductor layer 25. With this structure, a lower surface of the first conductivity type semiconductor layer 25 is exposed around the mesa M. The mesa M also has a groove 32 formed through the second conductivity type semiconductor layer 29 and the active layer 27 to expose the first conductivity type semiconductor layer 25.

The groove 32 has a shape surrounding the center of the mesa M and partially open. As indicated by a dotted line in FIG. 1, the groove 32 is arranged so as to surround a rectangular region including the center of the mesa M and may have an open portion at one corner thereof. Accordingly, a region of the mesa M surrounded by the groove 32 is connected to a region of the mesa M outside the groove 32 through the open portion of the groove 32. In this exemplary embodiment, the shortest distance from each point of the groove to the edge of the support substrate 51 or an edge of the mesa M may be substantially the same. Furthermore, all of the shortest distances from the center of the region of the mesa M surrounded by the groove 32 to upper, lower, left, and right sides of the groove 32 may be the same. Accordingly, electric current can be evenly dispersed over a large area of the mesa M including the region surrounded by the groove 32 and a region outside the groove 32. On the other hand, assuming that the groove 32 is continuous like four sides of a rectangle, the length of the open portion may be less than or equal to ¼ of the total length of the groove 32.

Although the groove 32 is illustrated as having a rectangular shape, specifically a square shape, so as to surround a substantially rectangular region in this exemplary embodiment, it should be understood that the groove 32 may be modified to have various shapes, as described below with reference to FIG. 9.

The first insulating layer 31 is disposed between the semiconductor stack structure 30 and the support substrate 51 and covers the first conductivity type semiconductor layer 25 exposed around the mesa M and the first conductivity type semiconductor layer 25 exposed through the groove 32. The first insulating layer 31 may also cover the side surface of the mesa M and a portion of the lower surface of the mesa M. In addition, the first insulating layer 31 may extend outward from the semiconductor stack structure 30. Here, the first insulating layer 31 has an opening, which exposes the first conductivity type semiconductor layer 25 around the mesa M and in the groove 32 such that the first electrode 39 is connected to the first conductivity type semiconductor layer 25, and an opening, which exposes the lower surface of the mesa M such that the second electrode 34 is connected to the second conductivity type semiconductor layer 29.

The first insulating layer 31 may be composed of a single layer or multiple layers of silicon oxide or silicon nitride, or may include a dispersed Bragg reflector in which insulating layers having different indices of refraction, such as $SiO_2/TiO_2$ or $SiO_2/Nb_2O_5$, are repeatedly stacked one above another.

The ohmic reflective layer 33 forms ohmic contact with the second conductivity type semiconductor layer 29 exposed through trenches of the first insulating layer 31. The ohmic reflective layer 33 may be formed to adjoin the first insulating layer 31 or may have an edge separated from the first insulating layer 31, as shown in the drawings. The ohmic reflective layer 33 may include a reflective layer formed of, for example, Ag, and may include a metal layer for ohmic contact, such as a Ni layer. The ohmic reflective layer 33 is confined in a region under the mesa M.

The protective metal layer 35 is disposed between the ohmic reflective layer 33 and the support substrate 51 and covers the ohmic reflective layer 33. The protective metal layer 35 may contact the second conductivity type semiconductor layer 29 exposed between the ohmic reflective layer 33 and the first insulating layer 31. The protective metal layer 35 also covers the first insulating layer 31 and extends outside a region under the semiconductor stack structure 30. The protective metal layer 35 has a trench exposing the first insulating layer 31 under the groove 32 of the mesa M.

The protective metal layer 35 prevents migration of metal elements, for example, Ag, from the ohmic reflective layer 33 and also prevents the side surface of the ohmic reflective layer 33 from being exposed to the outside. The protective metal layer 35 may include, for example, Pt, Ni, Ti, W, Au, or alloys thereof.

The second insulating layer 37 is disposed under the protective metal layer 35 to cover the protective metal layer 35. The second insulating layer 37 may cover the entire lower surface of the protective metal layer 35. In addition, the second insulating layer 37 may also cover a side surface of the protective metal layer 35 to prevent the side surface of the protective metal layer 35 from being exposed to the outside.

The second insulating layer 37 may be composed of a single layer or multiple layers of silicon oxide or silicon nitride, or may be a dispersed Bragg reflector in which insulating layers having different indices of refraction, such as $SiO_2/TiO_2$ or $SiO_2/Nb_2O_5$, are repeatedly stacked one above another.

The first electrode 39 is disposed between the second insulating layer 37 and the support substrate 51 and electrically contacts the first conductivity type semiconductor layer 25 through the first insulating layer 31 and the second insulating layer 37. The first electrode 39 is disposed between the second electrode 34 and the support substrate 51.

The first electrode 39 includes a first contact portion 39a connected to the first conductivity type semiconductor layer 25 around the mesa M and a second contact portion 39b connected to the first conductivity type semiconductor layer 25 in the groove 32. The first contact portion 39a and the second contact portion 39b are insulated from the mesa M by the first insulating layer 31 and the second insulating layer 37.

The first contact portion 39a has a shape surrounding the mesa M along the edge of the support substrate 51 and partially open near the upper electrode pad 55. On the other hand, the second contact portion 39b has a shape similar to the groove 32, as shown in FIG. 1. That is, the second contact portion 39b has a shape surrounding a region including the center of the mesa M and partially open.

As shown in FIG. 1, the open portion of the second contact portion 39b (or the groove 32) and the open portion of the first contact portion 39a may be disposed at opposite sides to face each other, without being limited thereto. Alternatively, the open portion of the second contact portion 39b (or the groove 32) and the open portion of the first contact portion 39a may be disposed in various ways so as not to face each other.

The first electrode 39 may include an ohmic contact layer for ohmic contact with the first conductivity type semiconductor layer 25 and may also include a reflective metal layer. For example, the first electrode 39 may include Cr/Al, and may further include Ti/Ni.

The first electrode-protection metal layer 41 may cover a lower surface of the first electrode 39. The first electrode-protection metal layer 41 protects the first electrode 39 by preventing diffusion of metal elements such as Sn from the bonding metal layer 45. The first electrode-protection metal layer 41 may include, for example, Au, and may further include Ti and Ni. The first electrode-protection metal layer 41 may be formed by, for example, repeatedly stacking Ti/Ni plural times, followed by stacking Au thereon.

The support substrate 51 may be bonded to the first electrode-protection metal layer 41 via the bonding metal layer 45. The bonding metal layer 45 may be formed of, for example, AuSn or NiSn. Alternatively, the support substrate 51 may be formed on the first electrode-protection metal layer 41 by, for example, plating. If the support substrate 51 is a conductive substrate, the support substrate 51 can act as a lower electrode pad. Alternatively, if the support substrate 51 is an insulating substrate, a lower electrode pad may be formed on the first electrode 39 or the first electrode-protection metal layer 41 disposed on the support substrate 51.

The upper insulating layer 53 may cover the upper and side surfaces of the semiconductor stack structure 30, particularly, the upper and side surfaces of the first conductivity type semiconductor layer 25. The upper insulating layer 53 covers the roughened surface R and may be formed along roughness of the roughened surface R. The upper insulating layer 53 may be composed of a single layer or multiple layers of silicon oxide or silicon nitride.

The upper electrode pad 55 is connected to the second electrode 34, for example, the protective metal layer 35, adjacent to the first conductivity type semiconductor layer 25. The upper electrode pad 55 may be disposed near the edge of the support substrate 51 and may be separated from the semiconductor stack structure 30 in the horizontal direction. The upper electrode pad 55 may be connected to the protective metal layer 35 through the first insulating layer 31 and the upper insulating layer 53.

The upper electrode pad 55 may be disposed at an opposite side of the open portion of the groove 32 so as to face the open portion. That is, the upper electrode pad 55 may be disposed near one corner of the support substrate 51 and the open portion of the groove 32 may be disposed near the other corner opposite the one corner, without being limited thereto. Alternatively, the open portion of the groove 32 may be disposed closer to one of other corners than the one corner of the support substrate 51, at which the upper electrode pad 55 is disposed, so as not to face the upper electrode pad 55.

The upper electrode pad 55 is insulated from the first conductivity type semiconductor layer 25. The upper electrode pad 55 is separated from the first electrode 39. Particularly, due to formation of the second contact portion 39b, the mesa M may be disposed farther from the upper electrode pad 55 than the first conductivity type semiconductor layer 25. Accordingly, light emitted from the side surface of the active layer 27 can be discharged through a region between the upper electrode pad 55 and the mesa M instead of being absorbed by the upper electrode pad 55, thereby improving light extraction efficiency.

An elevation of a plane in which the upper electrode pad 55 adjoins the protective metal layer 35 may be placed between the first conductivity type semiconductor layer 25 and the ohmic reflective layer 33, that is, in a region between the lower surface of the first conductivity type semiconductor layer 25 and a lower surface of the second conductivity type semiconductor layer 29. Accordingly, a bottom surface of the upper electrode pad 55 is placed under the lower surface of the first conductivity type semiconductor layer 25 while being placed above the lower surface of the second conductivity type semiconductor layer 29. The first insulating layer 31 is placed between the lower surface of the first conductivity type semiconductor layer 25 and the protective metal layer 35. With the structure wherein the elevation of the upper electrode pad 55 is placed above the lower surface of the second conductivity type semiconductor layer 29, various processes for forming the upper electrode pad 55 can be easily performed, thereby enabling a process of manufacturing a light emitting diode to be efficiently performed.

FIG. 3A to FIG. 8B are plan views and sectional views illustrating a method of manufacturing the light emitting diode according to the one exemplary embodiment of the present disclosure. The structure of the light emitting diode according to the one exemplary embodiment of the present disclosure will become more apparent through the method of manufacturing the light emitting diode described below.

Figure 3A:
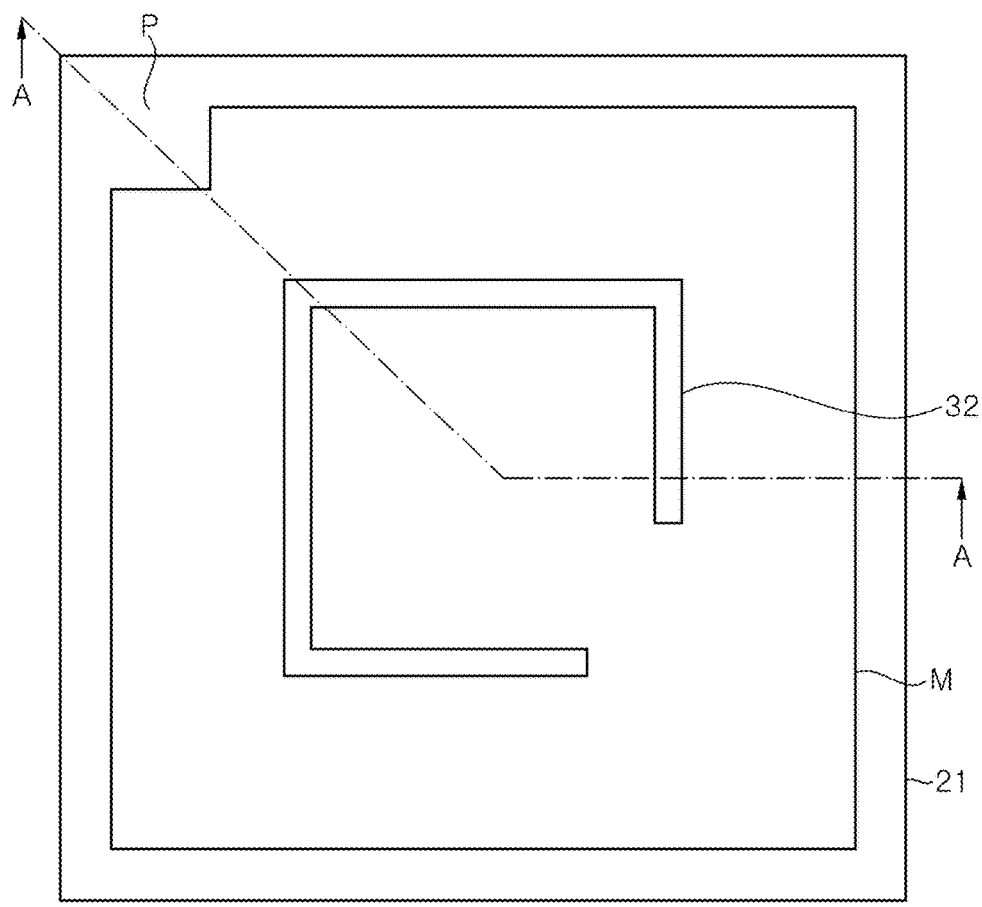
FIG. 3A to FIG. 8B are plan views and sectional views illustrating a method of manufacturing the light emitting diode according to the one exemplary embodiment of the present disclosure.
Figure 3B:
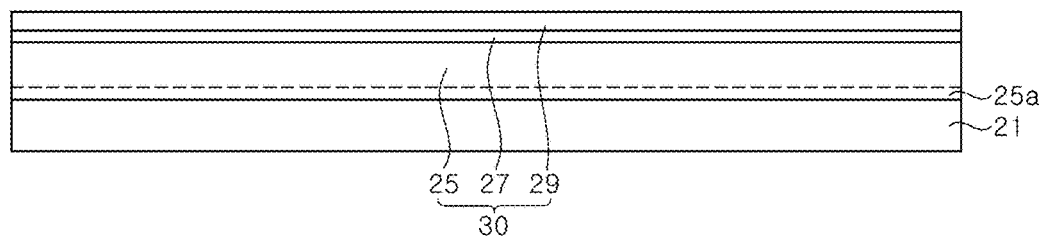
Figure 3C:
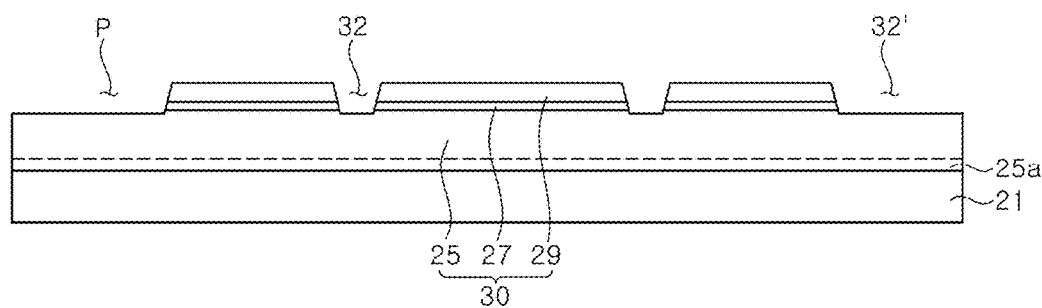

Referring to FIG. 3A, FIG. 3B and FIG. 3C, a semiconductor stack structure 30 including a first conductivity type semiconductor layer 25, an active layer 27 and a second conductivity type semiconductor layer 29 is formed on a growth substrate 21. The growth substrate 21 may be a sapphire substrate, without being limited thereto. Alternatively, the growth substrate 21 may be a different substrate such as a silicon substrate. Each of the first and second conductivity type semiconductor layers 25, 29 may be composed of a single layer or multiple layers. In particular, the first conductivity type semiconductor layer 25 may include an undoped nitride semiconductor layer 25a on the growth substrate 21 side. In addition, the active layer 27 may have a single quantum well structure or a multi-quantum well structure.

The compound semiconductor layers may be formed of III-N based compound semiconductors and may be grown on the growth substrate 21 by metal organic chemical vapor deposition (MOCVD), molecular beam epitaxy (MBE), or the like.

Before forming the compound semiconductor layers, a nucleation layer may be formed. The nucleation layer serves to relieve lattice mismatch between the sacrificial substrate 21 and the compound semiconductor layers, and may be a GaN-based material layer such as gallium nitride or aluminum nitride.

Then, as shown in FIG. 3C, the second conductivity type semiconductor layer 29 and the active layer 27 are subjected to patterning to expose the first conductivity type semiconductor layer 25. As a result, a mesa M is formed and the first conductivity type semiconductor layer 25 is exposed in a region 32' around the mesa M. Furthermore, the mesa M has a groove 32 formed therein and exposing the first conductivity type semiconductor layer 25. The groove 32 may be formed together with the mesa M. The groove 32 has a linear shape. The detailed shape of the groove 32 is described with reference to FIG. 1 and detailed description thereof will be omitted.

Although FIG. 3A shows a single light emitting diode region, it should be understood that a plurality of light emitting diode regions may be defined on a single wafer and isolation regions are disposed between these light emitting diode regions. In FIG. 3A, edges of the growth substrate 21 correspond to the isolation regions. In such isolation regions, the second conductivity type semiconductor layer 29 and the active layer 27 are removed to expose the first conductivity type semiconductor layer 25 during formation of the mesa M. Furthermore, in a region P for an upper electrode pad 55 described below, the second conductivity type semiconductor layer 29 and the active layer 27 are removed to expose the first conductivity type semiconductor layer 25. The second conductivity type semiconductor layer 29 and the active layer 27 are previously removed in the isolation regions and the region P for the upper electrode pad 55, thereby facilitating a process of forming the upper electrode pad 55 described below and a process of isolating light emitting diodes.

Figure 4A:
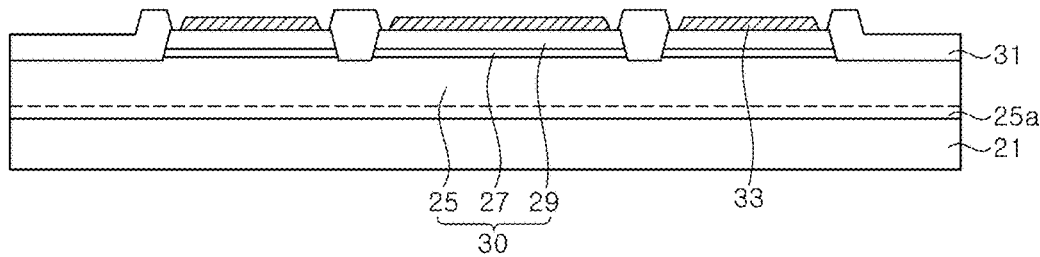
Figure 4B:
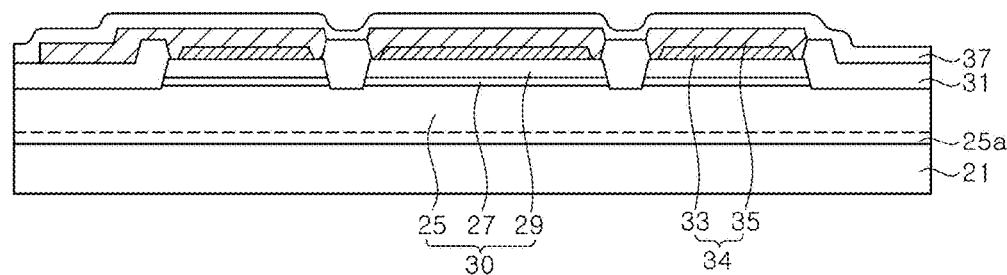

Referring to FIG. 4A, a first insulating layer 31 is formed to cover the mesa M. The first insulating layer 31 covers a side surface of the mesa M while covering the first conductivity type semiconductor layer 25 exposed around the mesa M and in the groove 32. The first insulating layer 31 may also cover a portion of an upper surface of the second conductivity type semiconductor layer 29. Here, the first insulating layer 31 exposes most of the upper surface of the second conductivity type semiconductor layer 29. The first insulating layer 31 exposes the upper surface of the second conductivity type semiconductor layer 29 in a region of the mesa M surrounded by the groove 32 and in a region of the mesa M outside the groove 32. Thus, a trench of the first insulating layer 31 formed in the region of the mesa M surrounded by the groove 32 is in communication with a trench of the first insulating layer 31 formed outside the groove 32.

The first insulating layer 31 may be deposited by plasma enhanced chemical vapor deposition and may be patterned by photolithography and etching.

Then, an ohmic reflective layer 33 is formed on the second conductivity type semiconductor layer 29. The ohmic reflective layer 33 may be deposited by electron beam evaporation and may be patterned by a lift-off process. A side surface of the ohmic reflective layer 33 may adjoin the first insulating layer 31 or may be separated from the first insulating layer 31, as shown in FIG. 4A.

Thereafter, a protective metal layer 35 is formed on the ohmic reflective layer 33. The protective metal layer 35 covers an upper surface of the ohmic reflective layer 33 and surrounds an edge 33a of the ohmic reflective layer 33 to cover the edge 33a of the ohmic reflective layer 33. A portion of the protective metal layer 35 may contact the second conductivity type semiconductor layer 29 between the first insulating layer 31 and the ohmic reflective layer 33. Here, the protective metal layer 35 may form Schottky contact with the second conductivity type semiconductor layer 29. Thus, no current is injected directly into the second conductivity type semiconductor layer 29 through the protective metal layer 35, thereby preventing current from crowding near the side surface of the mesa M. Furthermore, the protective metal layer 35 including a reflective layer can reflect light incident around the ohmic reflective layer 33, thereby improving light extraction efficiency.

The protective metal layer 35 exposes the first insulating layer 31 disposed in the groove 32. The protective metal layer 35 has a through-groove (or penetrating-groove) having a shape similar to the groove 32 and the first insulating layer 31 in the groove 32 is exposed through the through-groove.

The protective metal layer 35 covers the first insulating layer 31 around the mesa M and extends outside the mesa M. The protective metal layer 35 extending outside the mesa M is connected to the upper electrode pad 55.

A second insulating layer 37 is formed on the protective metal layer 35. The second insulating layer 37 covers an upper surface and a side surface of the protective metal layer 35. Accordingly, the second insulating layer 37 can prevent the protective metal layer 35 from being exposed to the outside. Alternatively, the second insulating layer 37 may be formed to cover the upper surface of the protective metal layer 35 without covering the side surface thereof such that the side surface of the protective metal layer 35 can be exposed to the outside in a finished light emitting diode.

Figure 5A:
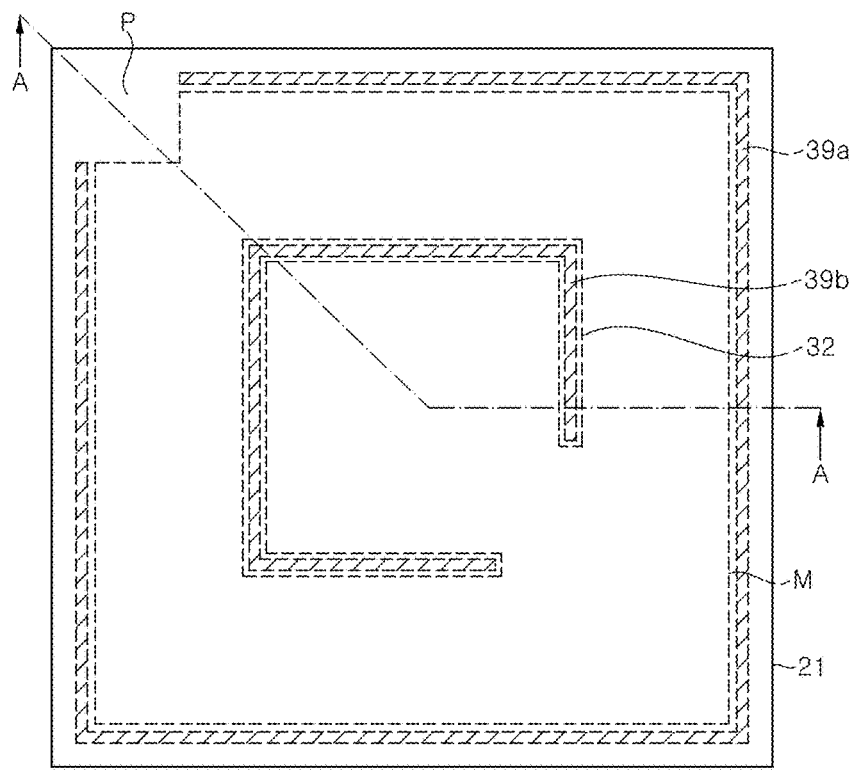
Figure 5B:
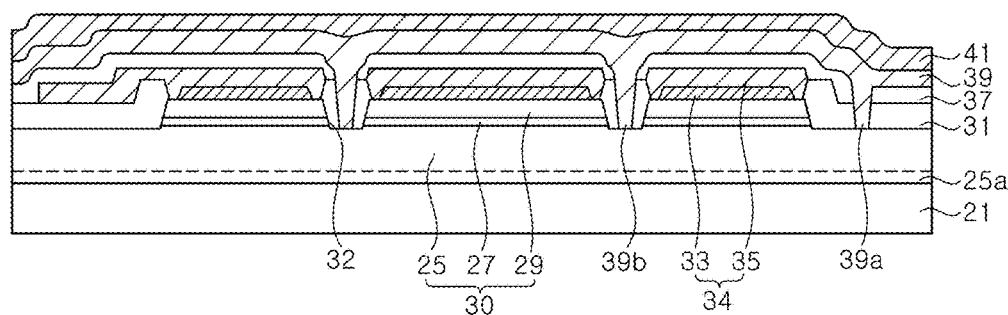
Figure 5C:
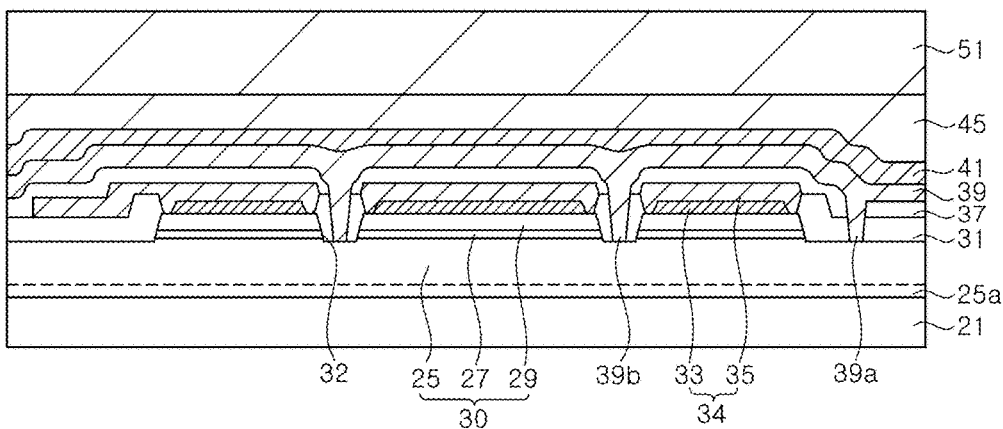

Referring to FIG. 5A, FIG. 5B and FIG. 5C, openings are formed to expose the first conductivity type semiconductor layer 25 around the mesa M and in the groove 32 through photolithography and etching of the second insulating layer 37 and the first insulating layer 31. Bottom surfaces of these openings correspond to a first contact portion 39a and a second contact portion 39b described below.

A first electrode 39 is formed on the second insulating layer 37. The first electrode 39 covers the second insulating layer 37 and has the first contact portion 39a and the second contact portion 39b connected to the first conductivity type semiconductor layer 25 through the openings formed through the second insulating layer 37 and the first insulating layer 31. The first contact portion 39a is connected to the first conductivity type semiconductor layer 25 around the mesa M and the second contact portion 39b is connected to the first conductivity type semiconductor layer 25 in the groove 32.

As shown in FIG. 5A, each of the first contact portion 39a and the second contact portion 39b has an open portion such that the open portions are disposed at opposite sides to face each other. As a result, current can be evenly dispersed over a large area of the mesa M. In particular, the open portion of the first contact portion 39a is placed near the upper electrode pad region P and the open portion of the second contact portion 39b is placed at an opposite side thereto.

A first electrode-protection metal layer 41 is formed on the first electrode 39. The first electrode-protection metal layer 41 is formed to prevent metal elements such as Sn from diffusing into the first electrode 39 and may include Ti, Ni and Au. The first electrode-protection metal layer 41 may be omitted.

Then, as shown in FIG. 5C, a support substrate 51 is attached to the semiconductor stack structure. The support substrate 51 may be manufactured separately from the semiconductor stack structure 30 and is then bonded to the first electrode 39 or the first electrode-protection metal layer 41 via a bonding metal layer 45. Alternatively, the support substrate 51 may be formed by plating the first electrode 39 or the first electrode-protection metal layer 41.

Figure 6:
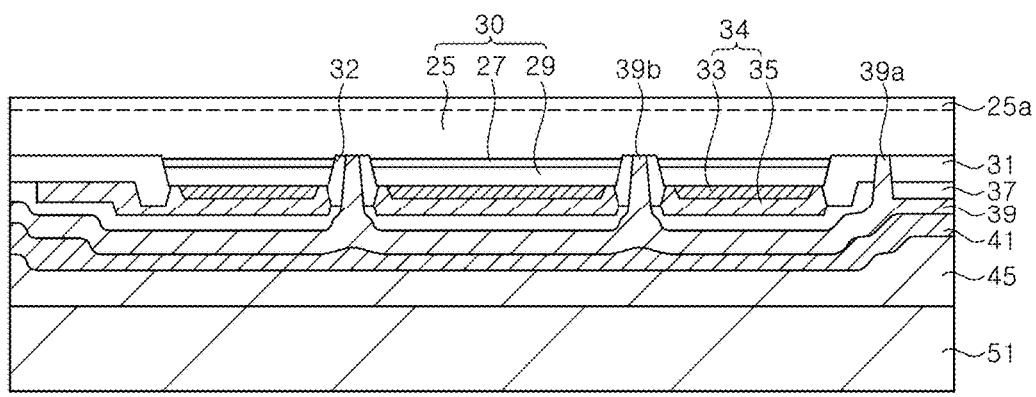

Referring to FIG. 6, the growth substrate 21 is removed to expose the surface of the first conductivity type semiconductor layer 25 of the semiconductor stack structure 30. Particularly, the undoped nitride semiconductor layer 25a may be exposed. The growth substrate 21 may be removed by, for example, a laser lift-off (LLO) process. After the growth substrate 21 is removed, the undoped nitride semiconductor layer 25a may be partially removed by etching in order to remove a region damaged by laser processing. Although the undoped nitride semiconductor layer 25a can be completely removed, at least part of the undoped nitride semiconductor layer 25a remains in this exemplary embodiment.

Figure 7A:
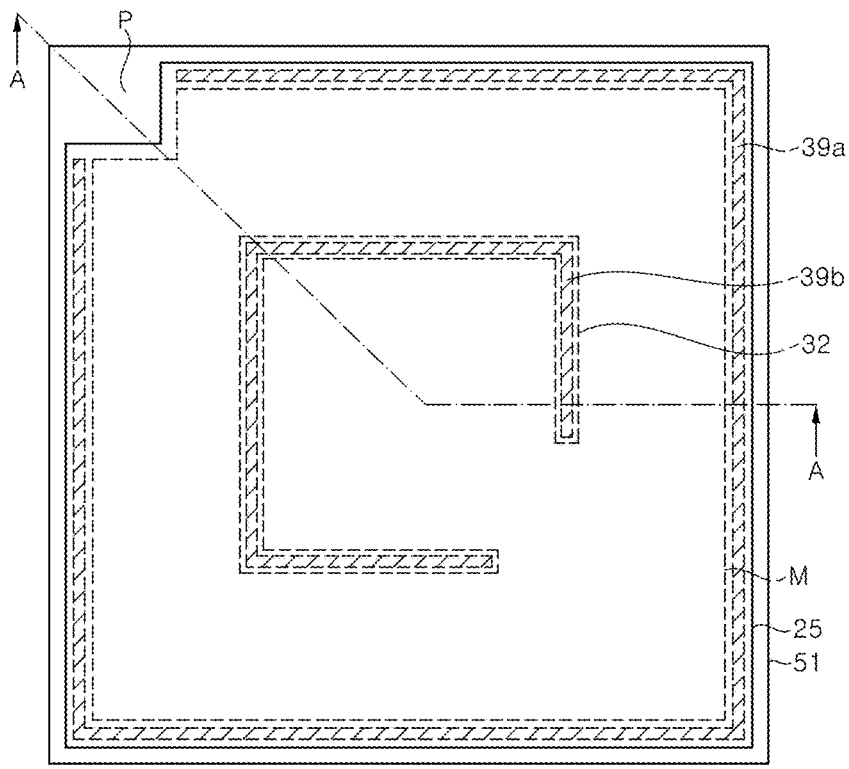
Figure 7B:
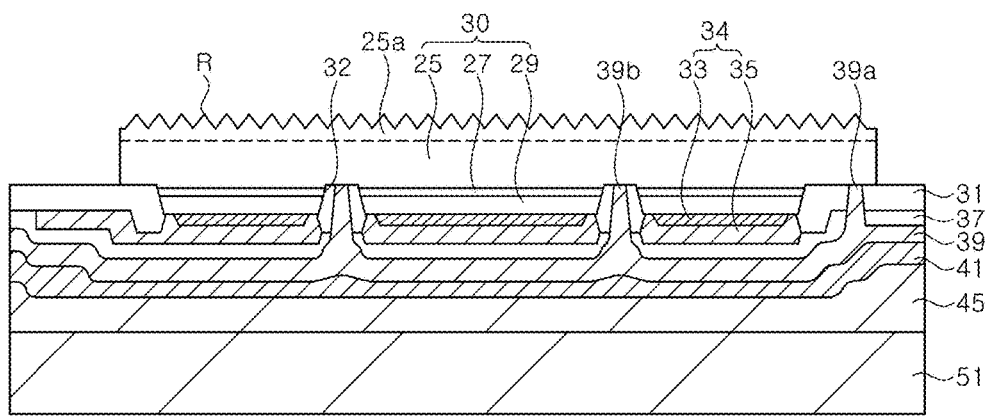

Referring to FIG. 7A and FIG. 7B, the first conductivity type semiconductor layer 25 is removed along isolation regions for light emitting diodes. Here, the first conductivity type semiconductor layer 25 in the upper electrode pad region is also removed. As the first conductivity type semiconductor layer 25 is removed, the first insulating layer 31 is exposed.

As described above, since the second conductivity type semiconductor layer 29 and the active layer 27 are previously removed from the isolation regions and the upper electrode pad region P upon formation of the mesa M, the first conductivity type semiconductor layer 25 can be removed without removing the second conductivity type semiconductor layer 29 and the active layer 27, when the semiconductor layers are removed from the isolation regions. Accordingly, it is possible to reduce process time in removal of the first conductivity type semiconductor layer 25 from the isolation regions, thereby further simplifying the manufacturing process.

In this exemplary embodiment, upon removal of the first conductivity type semiconductor layer 25, any other metal layers including the protective metal layer 35 are not exposed. Furthermore, since the second conductivity type semiconductor layer 29 and the active layer 27 are sealed by the first insulating layer 31, process reliability is high since there is no short circuit due to etching by-products of the metallic materials.

On the other hand, a roughened surface R is formed on the surface of the first conductivity type semiconductor layer 25. The roughened surface R may be formed by a technique such as photo-enhanced chemical etching. In particular, since there is no need for complete removal of the undoped nitride semiconductor layer 25a, PEC etching can be performed for a sufficient period of time, thereby increasing surface roughness of the roughened surface R. Further, since the undoped nitride semiconductor layer 25a remains, the thickness of the doped region in the first conductivity type semiconductor layer 25 can be kept relatively large, thereby assisting in current spreading.

Although the roughened surface R is illustrated as being formed after removal of the first conductivity type semiconductor layer 25 from the isolation regions in this exemplary embodiment, it should be understood that the roughened surface R may be formed before removal of the first conductivity type semiconductor layer 25 from the isolation regions in this exemplary embodiment.

Figure 8A:
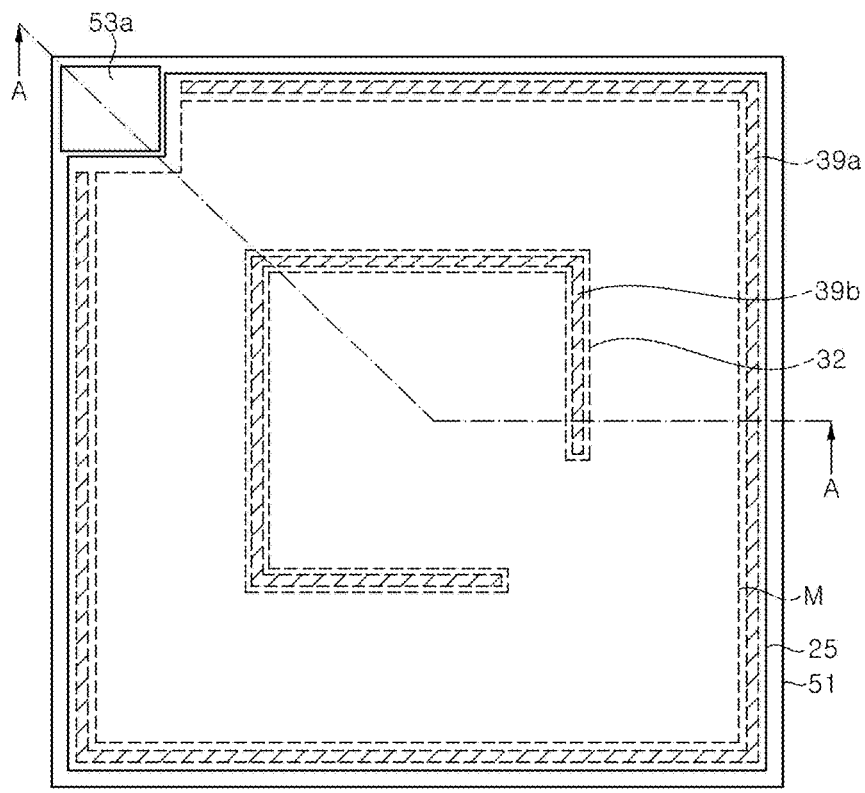
Figure 8B:
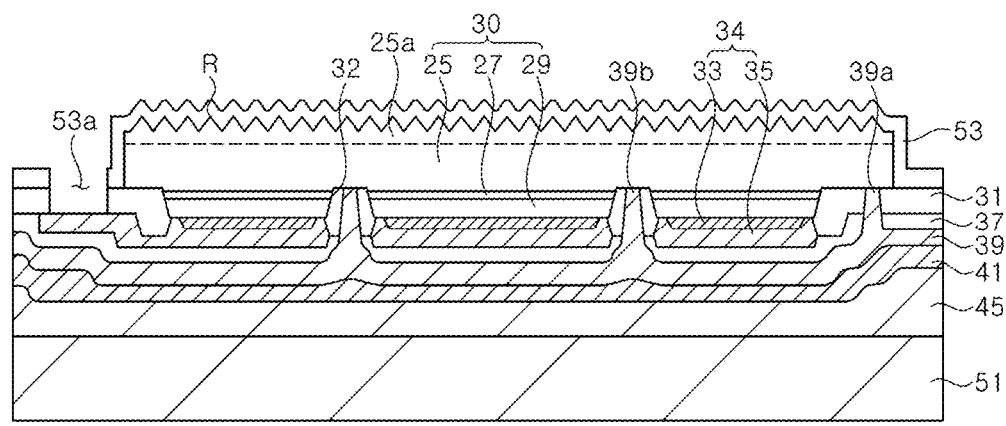

Referring to FIG. 8A and FIG. 8B, the upper insulating layer 53 is formed on the first conductivity type semiconductor layer 25 on which the roughened surface R is formed. The upper insulating layer 53 is formed along the roughened surface R to have a rough surface corresponding to the roughened surface R. The upper insulating layer 53 also covers the first insulating layer 31 exposed around the first conductivity type semiconductor layer 25.

Thereafter, a hole 53a is formed to expose the protective metal layer 35 by partially removing the upper insulating layer 53 and the first insulating layer 31. The hole 53a is formed in the upper electrode pad region P such that the protective metal layer 35 extending to the upper electrode pad region P is exposed. Thereafter, the upper electrode pad 55 (see FIG. 1) is formed to connect to the protective metal layer 35 exposed in the hole 53a and the semiconductor structure is divided into individual light emitting diodes along the isolation regions, thereby providing final light emitting diodes (see FIG. 1). Here, the first insulating layer 31, the second insulating layer 37, the first electrode 39, the first electrode-protection metal layer 41, the bonding metal layer 45 and the support substrate 51 may also be divided together, whereby the side surfaces thereof can be parallel to each other. On the other hand, the ohmic reflective layer 33 and the protective metal layer 35 are disposed in a region surrounded by the edges of the divided support substrate 51 and thus can be embedded in the light emitting diode without being exposed to the outside.

In this exemplary embodiment, since the second conductivity type semiconductor layer 29 and the active layer 27 are previously removed from the upper electrode pad region P upon formation of the mesa M, an interface between the first insulating layer 31 and the upper insulating layer 53 has an elevation closer to the surface of the first conductivity type semiconductor layer 25 in the upper electrode pad region P than the case where the second conductivity type semiconductor layer 29 and the active layer 27 are not previously removed. Accordingly, the process of forming the hole 53a is facilitated, and even when the upper surface of the upper electrode pad 55 has a constant elevation, the overall thickness of the upper electrode pad 55 can be reduced, thereby providing convenience in formation of the upper electrode pad 55.

Figure 9:
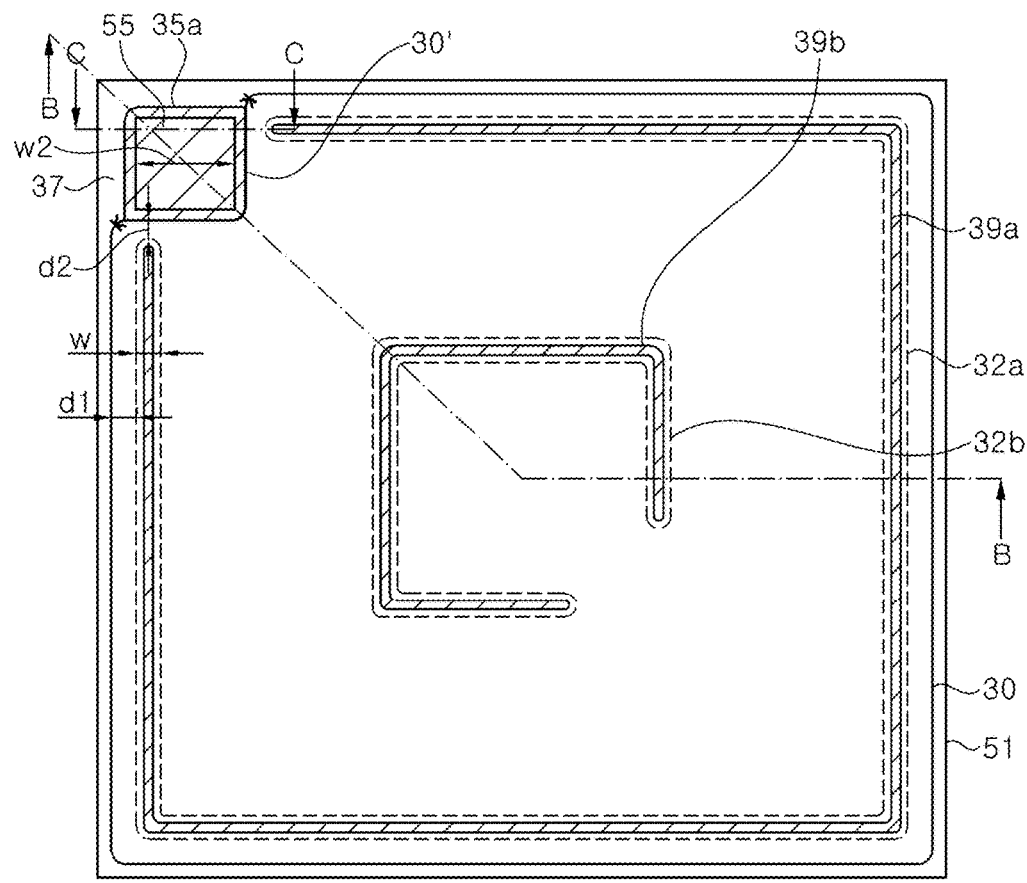
FIG. 9 is a schematic plan view of a light emitting diode according to another exemplary embodiment of the present disclosure.
Figure 10A:
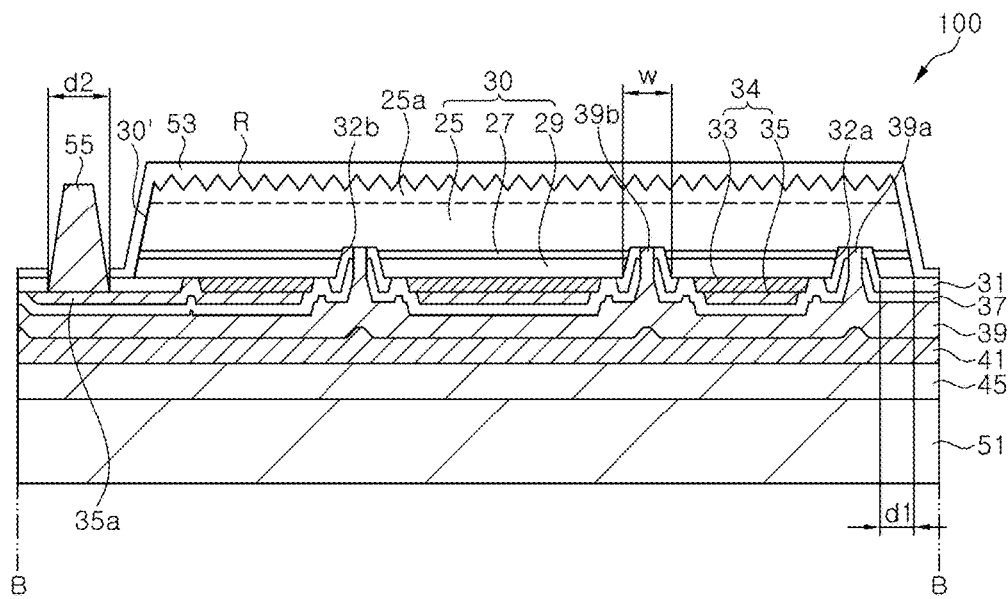
FIG. 10A is a cross-sectional view taken along line B-B of FIG. 9
Figure 10B:
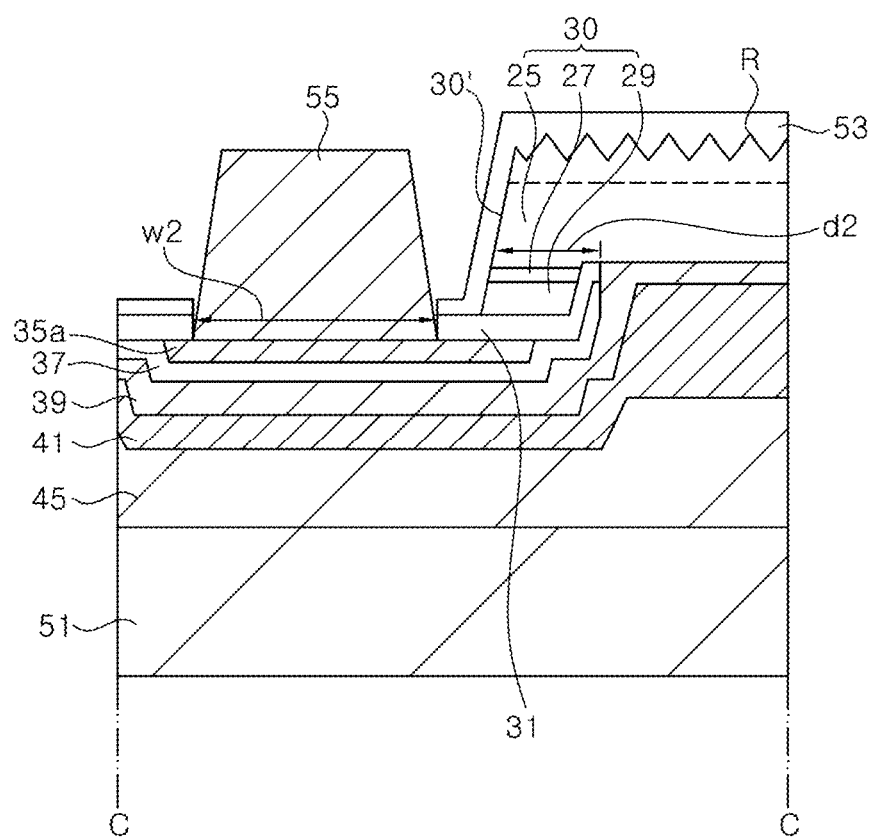
FIG. 10B is a cross-sectional view taken along line C-C of FIG. 9.

FIG. 9 is a schematic plan view of a light emitting diode according to another exemplary embodiment of the present disclosure and FIGS. 10A and 10B are cross-sectional views taken along line B-B of FIG. 9.

Referring to FIG. 9 and FIGS. 10A and 10B, a light emitting diode 100 according to this exemplary embodiment may include a support substrate 51, a semiconductor stack structure 30, a first insulating layer 31, a second insulating layer 37, a first electrode 39, a second electrode 34, a first electrode-protection metal layer 41, a bonding metal layer 45, an upper insulating layer 53, and an upper electrode pad 55. The semiconductor stack structure 30 may include a first conductivity type semiconductor layer 25, an active layer 27 and a second conductivity type semiconductor layer 29, and the second electrode 34 may include an ohmic reflective layer 33 and a protective metal layer 35.

Referring to FIG. 9, the support substrate 51 has a rectangular upper surface. Here, it should be understood that the upper surface of the support substrate 51 is not limited to a rectangular shape and may be changed in various ways without departing from the scope of the present disclosure. The semiconductor stack structure 30 may be disposed in some region of the support substrate 51 corresponding to the shape of the support substrate 51. Here, the semiconductor stack structure 30 may have an recess near one corner of the support substrate 51. The recess is formed by partially etching the semiconductor stack structure 30 in order to dispose the upper electrode pad 55 on the support substrate 51. Referring to FIG. 9, an inner side 30' of the recess is indicated by a bold line and the boundary thereof is defined by arrows at both sides thereof. An extension region of the second electrode 34 may protrude outside the inner side 30' of the recess and the upper electrode pad 55 may be connected to the extension region of the second electrode 34, as described below.

According to this exemplary embodiment, the second conductivity type semiconductor layer 29 and the active layer 27 may not be subjected to etching at an edge of the semiconductor stack structure 30. Accordingly, the semiconductor stack structure 30 may be formed such that the side surface of the second conductivity type semiconductor layer 29, the side surface of the active layer 27 and the side surface of the first conductivity type semiconductor layer 25 are flush with each other. In particular, the inner side 30' of the recess adjacent to the upper electrode pad 55 may include all of the side surface of the second conductivity type semiconductor layer 29, the side surface of the active layer 27 and the side surface of the first conductivity type semiconductor layer 25.

On the other hand, the semiconductor stack structure 30 may include a first groove 32a and a second groove 32b formed through the second conductivity type semiconductor layer 29 and the active layer 27 to expose the first conductivity type semiconductor layer 25.

The first groove 32a is disposed along the edge of the semiconductor stack structure 30 and may have both ends near the upper electrode pad 55. As shown in FIG. 9, the first groove 32a may be formed in a linear shape, but is not limited thereto. Alternatively, the first groove 32a may include a plurality of grooves disposed along the edge of the semiconductor stack structure 30 and separated from each other.

The first groove 32a has a smaller width w1 than the length of the first groove 32a. That is, the first groove 32a may have an elongated band shape having a width w1. In addition, when the first groove 32a includes the plurality of grooves separated from each other, each of these grooves also has a smaller width w1 than the length thereof. Further, the first groove 32a may be separated a predetermined distance from the side surface of the semiconductor stack structure 30 while surrounding the center of the semiconductor stack structure 30.

A separation distance d1 between the first groove 32a and the side surface of the semiconductor stack structure 30 may be defined for the purpose of horizontal current spreading. As described below, since the first electrode 39 is connected to the first conductivity type semiconductor layer 25 through the first groove 32a, the separation distance d1 between the first groove 32a and the semiconductor stack structure 30 is defined so as to secure efficient current spreading to the side surface of the light emitting diode. For example, the separation distance d1 between the first groove 32a and the side surface of the semiconductor stack structure 30 may be smaller than the minimum width w2 of the upper electrode pad 55. In particular, the separation distance d1 between the first groove 32a and the side surface of the semiconductor stack structure 30 may be restricted to be smaller than half the minimum width w2 of the upper electrode pad 55.

On the other hand, as shown in FIG. 9 and FIG. 10B, the first groove 32a may be open at one corner thereof and may include both ends. Both ends of the first groove 32a may be disposed to face the side surface of the semiconductor stack structure 30, particularly, the inner side 30' of the recess. Here, each end of the first groove 32a may be separated from the inner side 30' of the recess. A separation distance d2 between the end of the first groove 32a and the inner side 30' of the recess may be smaller than the minimum width w2 of the upper electrode pad 55. In particular, the separation distance d2 between the end of the first groove 32a and the inner side 30' of the recess may be restricted to be smaller than half the minimum width w2 of the upper electrode pad 55. With the structure wherein the inner side 30' of the recess is separated from the end of the first groove 32a, the inner side 30' of the recess may include all of side surfaces of the first conductivity type semiconductor layer 25, the active layer 27 and the second conductivity type semiconductor layer 29. In addition, the separation distance d2 between the end of the first groove 32a and the inner side 30' of the recess may be restricted to a predetermined value or less, current can be efficiently dispersed between the end of the first groove 32a and the inner side 30' of the recess.

The second groove 32b is disposed inside the first groove 32a to surround the center of the semiconductor stack structure 30. The second groove 32b may be disposed closer to the center of the semiconductor stack structure 30 than the first groove 32a.

Like the first groove 32a, the second groove 32b may have an open portion at one corner thereof. As indicated by a dotted line in FIG. 9, the second groove 32b may have a shape surrounding a rectangular region including the center of the semiconductor stack structure 30 and having an open portion at one corner thereof. A region of the semiconductor stack structure 30 surrounded by the second groove 32b may be connected to a region of the semiconductor stack structure 30 disposed between the second groove 32b and the first groove 32a through the open portion of the second groove 32b.

The open portion of the first groove 32a and the open portion of the second groove 32b may be disposed in opposite directions with reference to the center of the semiconductor stack structure 30. For example, referring to FIG. 9, the open portion of the first groove 32a and the open portion of the second groove 32b may be disposed at opposite sides to face each other.

Further, the shortest distance from each point of the first groove 32a to the second groove 32b may be substantially the same. Furthermore, all of the shortest distances from the center of the region of the semiconductor stack structure 30 surrounded by the second groove 32b to upper, lower, left, and right sides of the second groove 32b may be the same. As described below, with the structure wherein the first electrode 39 is connected to the first conductivity type semiconductor layer 25 through the first and second grooves 32a, 32b, electric current can be evenly dispersed over a large area of the semiconductor stack structure 30 through the first and second grooves 32a, 32b.

Although the first groove 32a and the second groove 32b are illustrated as having a rectangular shape, specifically a square shape, so as to surround a substantially rectangular region in this exemplary embodiment, it should be understood that the first groove 32a and the second groove 32b may be modified to have various shapes, as described below with reference to FIG. 18A-D and FIG. 19A-E.

As described above, since the second conductivity type semiconductor layer 29 and the active layer 27 are not removed by etching at the edge of the semiconductor stack structure 30, a lower surface of the semiconductor stack structure 30 may not have a step. That is, most regions of the lower surface of the semiconductor stack structure 30 may have the same elevation excluding the first and second grooves 32a, 32b, whereby the semiconductor stack structure 30 can be stably disposed on the support substrate 51 (or on other components, for example, the first insulating layer, the second electrode, and the like, disposed on the support substrate). In particular, since a region of the semiconductor stack structure 30 disposed outside the first groove 32a or between both ends of the first groove 32a does not have a step, bonding strength or coupling strength to the support substrate 51 at the edge of the semiconductor stack structure 30 can be enhanced. Furthermore, the active layer 27 is not removed by etching at the edge of the semiconductor stack structure 30, thereby securing a luminous region.

The first insulating layer 31 may be disposed between the semiconductor stack structure 30 and the first electrode 39 and may cover the lower surface of the semiconductor stack structure 30. In addition, the first insulating layer 31 may extend outward from the side surface of semiconductor stack structure 30 to cover the support substrate 51.

Specifically, the first insulating layer 31 may contact the second conductivity type semiconductor layer 29 to cover a portion of the lower surface of the second conductivity type semiconductor layer 29. Here, the first insulating layer 31 may have an opening exposing the second conductivity type semiconductor layer 29. The second electrode 34 may be connected to the second conductivity type semiconductor layer 29 through the opening of the first insulating layer 31.

The first insulating layer 31 contacting the second conductivity type semiconductor layer 29 may extend outward from the side surface of the semiconductor stack structure 30. Here, an extended portion of the first insulating layer 31 extending outward from the side surface of the semiconductor stack structure 30 may extend flush from a portion of the first insulating layer 31 contacting the second conductivity type semiconductor layer 29. In particular, the extended portion of the first insulating layer 31, which extends outside the inner side 30' of the recess adjacent to the upper electrode pad 55, may extend flush from the portion of the first insulating layer 31 contacting the second conductivity type semiconductor layer 29.

On the other hand, the first insulating layer 31 extending outside the inner side 30' of the recess may include an opening exposing the extension region 35a of the second electrode 34 and the upper electrode pad 55 may contact the extension region 35a through the opening of the first insulating layer 31.

In addition, the first insulating layer 31 may cover the first and second grooves 32a, 32b. The first insulating layer 31 may cover the side surface of the active layer 27 and the side surface of the second conductivity type semiconductor layer 29 exposed in the first and second grooves 32a, 32b. On the other hand, the first insulating layer 31 disposed in the first and second grooves 32a, 32b may have openings that expose the first conductivity type semiconductor layer 25 such that the first electrode 39 is connected to the first conductivity type semiconductor layer 25 therethrough by the first insulating layer 31. The first electrode 39 is connected to the first conductivity type semiconductor layer 25 in the first and second grooves 32a, 32b by the first insulating layer 31 while being prevented from being connected to the active layer 27 and the second conductivity type semiconductor layer 29.

According to this exemplary embodiment, the lower surface of the semiconductor stack structure 30 does not have a step, whereby the first insulating layer 31 contacting the second conductivity type semiconductor layer 29 can have a flat shape on the lower surface of the semiconductor stack structure 30. The structure of the first insulating layer 31 having a flat shape suppresses change in morphology of the second electrode 34, whereby the light emitting diode can have structural stability and suffer from a low defect rate. If the edge of the semiconductor stack structure 30 is removed by etching to have a mesa structure, a rapid structural change can occur between the region of the first insulating layer 31 covering the mesa and the region of the first insulating layer 31 covering the first conductivity type semiconductor layer 25 exposed on a side surface of the mesa by etching. That is, the first insulating layer 31 covering the second conductivity type semiconductor layer 29 on the mesa and the first conductivity type semiconductor layer 25 around the mesa do not have a flat shape and undergoes change in morphology corresponding to the elevation of the mesa. Furthermore, the second electrode 34 disposed under the first insulating layer 31 also undergoes the same morphology change as the first insulating layer 31. With such a structure, the first insulating layer 31 and the second electrode 34 are not structurally stable and can be damaged by an etchant during wet etching. In severe cases, the semiconductor stack structure 30 disposed on the first insulating layer 31 can be peeled or torn out. Thus, according to the exemplary embodiments, the edge of the semiconductor stack structure 30, particularly, the inner side 30' of the recess adjacent to the upper electrode pad 55 is not subjected to mesa etching, thereby preventing the semiconductor stack structure 30 from being peeled or torn out near the upper electrode pad 55.

Referring to FIG. 10A and FIG. 10B, the first insulating layer 31 is continuously formed along the inner side 30' of the recess, whereby foreign substances such as moisture can be prevented from penetrating into the second electrode 34 formed of a metallic material, particularly, the ohmic reflective layer 33.

The first insulating layer 31 may be composed of a single layer or multiple layers of silicon oxide or silicon nitride, or may include a dispersed Bragg reflector in which insulating layers having different indices of refraction are repeatedly stacked one above another. In the structure wherein the first insulating layer 31 includes the dispersed Bragg reflector, the first insulating layer 31 may further include an interfacial layer between the dispersed Bragg reflector and the semiconductor stack structure 30. The first insulating layer 31 may include, for example, $SiO_2$, $MgF_2$, $TiO_2$ or $Nb_2O_5$. By way of example, the first insulating layer 31 may include a dispersed Bragg reflector, in which $TiO_2/SiO_2$ or $Nb_2O_5/SiO_2$ are repeatedly stacked on a $SiO_2$ or $MgF_2$ interfacial layer.

The second electrode 34 may include the ohmic reflective layer 33 and the protective metal layer 35. The ohmic reflective layer 33 may form ohmic contact with the second conductivity type semiconductor layer 29 exposed through the openings of the first insulating layer 31. The ohmic reflective layer 33 may be formed to adjoin the first insulating layer 31 or may have an edge separated from the first insulating layer 31, as shown in the drawings. The ohmic reflective layer 33 may include a reflective layer formed of, for example, Ag, and may include a metal layer for ohmic contact, such as a Ni layer. The ohmic reflective layer 33 is confined in a region under the semiconductor stack structure 30.

The protective metal layer 35 is disposed between the ohmic reflective layer 33 and the support substrate 51 and covers the ohmic reflective layer 33. The protective metal layer 35 can suppress diffusion of metal elements, for example, Ag, from the ohmic reflective layer 33 to an insulating layer or an electrode (for example, the first insulating layer and the first electrode) adjacent thereto. The protective metal layer 35 may include, for example, Pt, Ni, Ti, W, Au, or alloys thereof.

According to this exemplary embodiment, the protective metal layer 35 partially covers a lower surface of the ohmic reflective layer 33 without covering the side surface of the ohmic reflective layer 33. In a structure wherein the protective metal layer 35 covers the side surface of the ohmic reflective layer 33, the area of the ohmic reflective layer 33 can be reduced by the protective metal layer 35, thereby decreasing an ohmic contact area between the ohmic reflective layer 33 and the second conductivity type semiconductor layer 29. In this exemplary embodiment, the protective metal layer 35 covers only a portion of the lower surface of the ohmic reflective layer 33, whereby a sufficient ohmic contact area between the ohmic reflective layer 33 and the second conductivity type semiconductor layer 29 can be secured, thereby lowering forward voltage (Vf).

A portion of the protective metal layer 35 covering the ohmic reflective layer 33 may extend toward the inner side 30' of the recess to cover the first insulating layer 31. In addition, the protective metal layer 35 may protrude outside the inner side 30' of the recess to form the extension region 35a of the second electrode 34. Here, the extension region 35a of the second electrode 34 may be disposed under the first insulating layer 31 and may be partially exposed through the openings of the first insulating layer 31. Further, the extension region 35a of the second electrode 34 may be disposed below the second conductivity type semiconductor layer 29 in terms of structure.

As mentioned above, according to this exemplary embodiment, the semiconductor stack structure 30 does not have a mesa structure, whereby the first insulating layer 31 does not suffer from morphology change in the side surface of the semiconductor stack structure 30 excluding the first groove 32a and the second groove 32b. Accordingly, like the first insulating layer 31, the protective metal layer 35 covering the first insulating layer 31 in a region near the inner side 30' of the recess does not suffer from morphology change. In addition, since the first insulating layer 31 contacting the second conductivity type semiconductor layer 29 has a flat shape without a step, the protective metal layer 35 disposed under the first insulating layer 31 may also have a flat shape without a step. The protective metal layer 35 may be composed of a plurality of layers. Thus, since the protective metal layer 35 has a step corresponding to the slope of the mesa, there can be a high risk of cracking. Accordingly, in this exemplary embodiment, the protective metal layer 35 has a flat shape to provide a light emitting diode with high yield. In addition, a problem of current leakage can be solved by stabilizing the structure of the light emitting diode.

The second insulating layer 37 is disposed under the protective metal layer 35 to cover the protective metal layer 35. The second insulating layer 37 may cover the entire lower surface of the protective metal layer 35. Furthermore, the second insulating layer 37 may cover a side surface of the protective metal layer 35 to prevent the side surface of the protective metal layer 35 from being exposed to the outside.

Further, the second insulating layer 37 may cover the first and second grooves 32a, 32b and include openings exposing the first conductivity type semiconductor layer 25 in the first and second grooves 32a, 32b. The first electrode 39 may contact the first conductivity type semiconductor layer 25 through the openings of the first insulating layer 31 and the openings of the second insulating layer 37 in the first and second grooves 32a, 32b.

The second insulating layer 37 may be composed of a single layer or multiple layers of silicon oxide or silicon nitride, or may include a dispersed Bragg reflector in which insulating layers having different indices of refraction, such as $SiO_2/TiO_2$ or $SiO_2/Nb_2O_5$ are repeatedly stacked one above another. In the structure wherein the second insulating layer 37 includes the dispersed Bragg reflector, the second insulating layer 37 may further include an interfacial layer between the dispersed Bragg reflector and the first insulating layer 31. The second insulating layer 37 may include, for example, $SiO_2$, $MgF_2$, $TiO_2$ or $Nb_2O_5$. By way of example, the second insulating layer 37 may include a dispersed Bragg reflector, in which $TiO_2/SiO_2$ or $Nb_2O_5/SiO_2$ are repeatedly stacked on a $SiO_2$ or $MgF_2$ interfacial layer.

The first electrode 39 is disposed between the second insulating layer 37 and the support substrate 51 and is electrically connected to the first conductivity type semiconductor layer 25 through the first insulating layer 31 and the second insulating layer 37. The first electrode 39 is disposed between the second electrode 34 and the support substrate 51.

The first electrode 39 has a first contact portion 39a connected to the first conductivity type semiconductor layer 25 in the first groove 32a and a second contact portion 39b connected to the first conductivity type semiconductor layer 25 in the second groove 32b. The first electrode 39 is insulated from the active layer 27 and the second conductivity type semiconductor layer 29 by the first insulating layer 31 and the second insulating layer 37.

The first contact portion 39a is formed along the edge of the semiconductor stack structure 30 and may have a shape surrounding the center thereof. The first contact portion 39a may have a shape similar to the first groove 32a. Here, the first contact portion 39a may be partially open near the upper electrode pad 55, like the first groove 32a. On the other hand, the second contact portion 39b has a shape similar to the second groove 32b, as shown in FIG. 9. That is, the second contact portion 39b has a shape surrounding a region including the center of the semiconductor stack structure 30 and partially open.

As shown in FIG. 9, an open portion of the first contact portion 39a (or the first groove 32a) and an open portion of the second contact portion 39b (or the second groove 32b) may be disposed at opposite sides to face each other, without being limited thereto. Alternatively, the open portion of the first contact portion 39a (or the first groove 32a) and the open portion of the second contact portion 39b (or the second groove 32b) may be disposed in various ways so as not to face each other.

The first electrode 39 may include an ohmic contact layer for ohmic contact with the first conductivity type semiconductor layer 25 and may also include a reflective metal layer. For example, the first electrode 39 may include Cr/Al, and may further include Ti/Ni.

The first electrode-protection metal layer 41 may cover a lower surface of the first electrode 39. The first electrode-protection metal layer 41 protects the first electrode 39 by preventing diffusion of metal elements such as Sn from the bonding metal layer 45. The first electrode-protection metal layer 41 may include, for example, Au, and may further include Ti and Ni. The first electrode-protection metal layer 41 may be formed by, for example, repeatedly stacking Ti/Ni plural times, followed by stacking Au thereon.

The support substrate 51 may be bonded to the first electrode-protection metal layer 41 via the bonding metal layer 45. The bonding metal layer 45 may be formed of, for example, AuSn or NiSn. Alternatively, the support substrate 51 may be formed on the first electrode-protection metal layer 41 by, for example, plating. If the support substrate 51 is a conductive substrate, the support substrate 51 can act as a lower electrode pad. Alternatively, if the support substrate 51 is an insulating substrate, a lower electrode pad may be formed on the first electrode 39 or the first electrode-protection metal layer 41 disposed on the support substrate 51.

The upper insulating layer 53 may cover the upper and side surfaces of the semiconductor stack structure 30. In particular, the upper insulating layer 53 may cover the inner side 30' of the recess adjacent to the upper electrode pad 55. The side surface of the semiconductor stack structure 30 adjacent to the upper electrode pad 55, that is, the inner side 30' of the recess, may include all of the side surface of the first conductivity type semiconductor layer 25, the side surface of the active layer 27 and the side surface of the second conductivity type semiconductor layer 29, which have a continuous shape. Accordingly, the upper insulating layer 53 covering the side surface of the semiconductor stack structure 30 has a structure covering all of the side surface of the first conductivity type semiconductor layer 25, the side surface of the active layer 27 and the side surface of the second conductivity type semiconductor layer 29 and also has a continuous shape.

This structure can prevent electric short circuit due to connection of the upper electrode pad 55 to the side surface of the semiconductor stack structure 30.

The upper insulating layer 53 covers a roughened surface R of the semiconductor stack structure 30 and may be formed along roughness of the roughened surface R. The upper insulating layer 53 may be composed of a single layer or multiple layers of silicon oxide or silicon nitride.

The upper electrode pad 55 may be disposed adjacent to the inner side 30' of the recess near the recess and may contact the extension region 35a of the second electrode 34.

The open portion of the second groove 32b may be placed at an opposite side of the upper electrode pad 55. That is, the upper electrode pad 55 may be disposed near one corner of the support substrate 51 corresponding to the open portion of the first groove 32a. Alternatively, the open portion of the second groove 32b may be disposed near the other corner opposite the one corner of the support substrate 51, at which the upper electrode pad 55 is disposed. However, it should be understood that other implementations are also possible. The open portion of the second groove 32b may be disposed closer to one of other corners than the one corner of the support substrate 51, at which the upper electrode pad 55 is disposed, so as not to face the upper electrode pad 55. The upper electrode pad 55 is separated from the semiconductor stack structure 30 and insulated from the side surface of the semiconductor stack structure 30 by the upper insulating layer 53. The upper electrode pad 55 is also separated from the first electrode 39.

FIG. 11A to FIG. 16B are plan views and sectional views illustrating a method of manufacturing the light emitting diode according to another exemplary embodiment of the present disclosure. The structure of the light emitting diode according to this exemplary embodiment of the present disclosure will become more apparent through the method of manufacturing the light emitting diode described below.

Figure 11A:
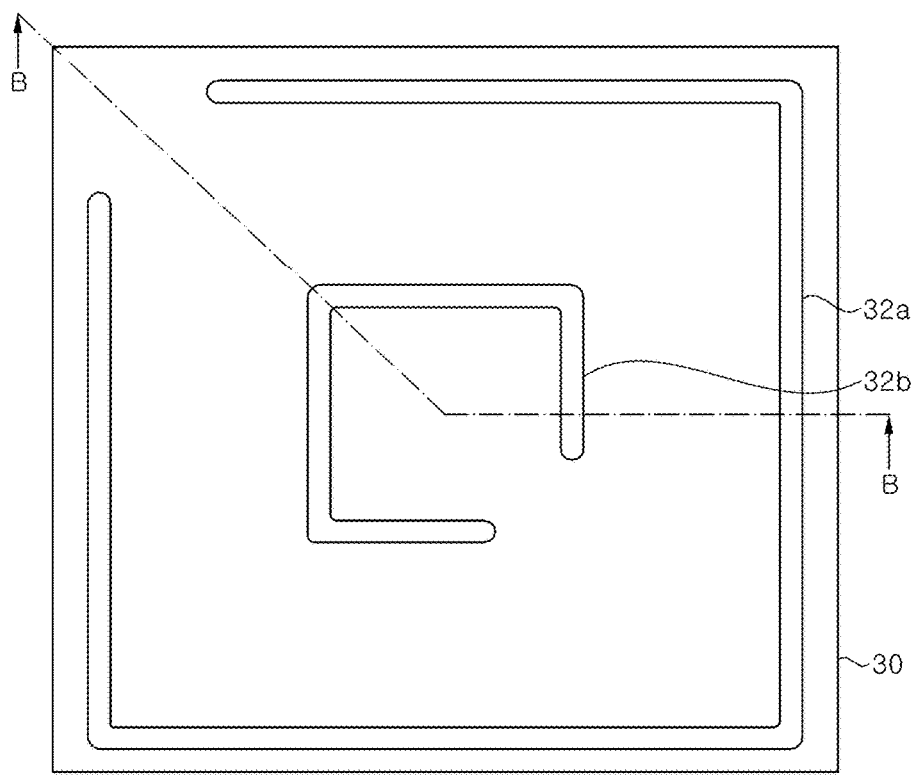
FIG. 11A to FIG. 16B are plan views and sectional views illustrating a method of manufacturing the light emitting diode according to another exemplary embodiment of the present disclosure.
Figure 11B:
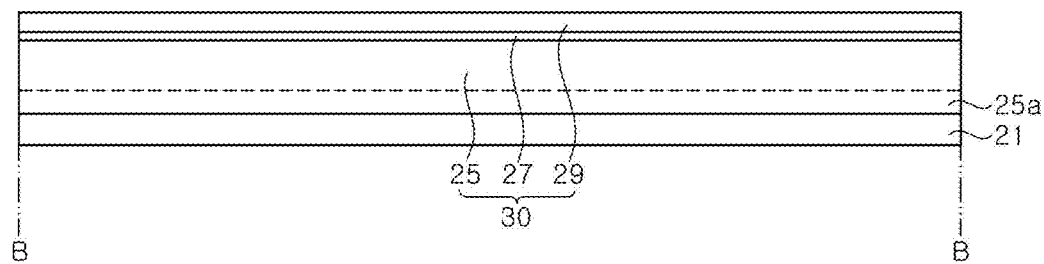
Figure 11C:
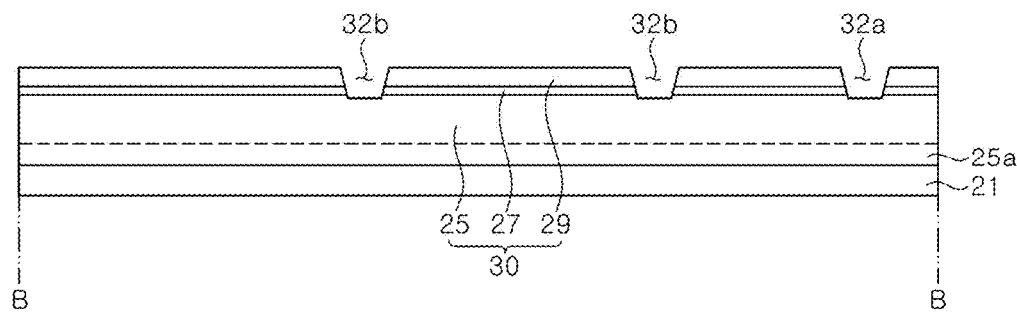

Referring to FIG. 11A, FIG. 11B and FIG. 11C, a semiconductor stack structure 30 including a first conductivity type semiconductor layer 25, an active layer 27 and a second conductivity type semiconductor layer 29 is formed on a growth substrate 21. The first conductivity type semiconductor layer 25 may include an undoped nitride semiconductor layer 25a on the growth substrate 21 side.

Referring to FIG. 11B, the compound semiconductor layers may be formed of III-N based compound semiconductors and may be grown on the growth substrate 21 by metal organic chemical vapor deposition (MOCVD), molecular beam epitaxy (MBE), or the like. Before forming the compound semiconductor layers, a nucleation layer may be formed. The nucleation layer serves to relieve lattice mismatch between the sacrificial substrate 21 and the compound semiconductor layers, and may be a GaN-based material layer such as gallium nitride or aluminum nitride.

Then, as shown in FIG. 11C, the second conductivity type semiconductor layer 29 and the active layer 27 are subjected to patterning to expose the first conductivity type semiconductor layer 25. Accordingly, a first groove 32a and a second groove 32b are formed in the semiconductor stack structure 30 to expose the first conductivity type semiconductor layer 25 therein. Here, the edge of the semiconductor stack structure 30 is not subjected to mesa etching and thus may include all of the first conductivity type semiconductor layer 25, the active layer 27 and the second conductivity type semiconductor layer 29 in other regions excluding regions in which the first and second grooves 32a, 32b are formed. In particular, the side surface of the semiconductor stack structure 30 includes all of side surfaces of the first conductivity type semiconductor layer 25, the active layer 27 and the second conductivity type semiconductor layer 29.

The first groove 32a may be formed to surround the center of the semiconductor stack structure 30 and to be separated a predetermined distance from the side surface of the semiconductor stack structure 30. The semiconductor stack structure 30 disposed outside the first groove 32a is not removed by etching and may include all of the first conductivity type semiconductor layer 25, the active layer 27 and the second conductivity type semiconductor layer 29. The second groove 32b may be disposed inside the first groove 32a and surround the center of the semiconductor stack structure 30.

The detailed shapes of the first and second the first and second grooves 32a, 32b are described with reference to FIG. 9 and detailed description thereof will be omitted.

Although FIG. 11A shows a single light emitting diode region, it should be understood that a plurality of light emitting diode regions may be defined on a single wafer and isolation regions are disposed between these light emitting diode regions. In FIG. 11A, edges of the growth substrate 21 correspond to the isolation regions.

Figure 12A:
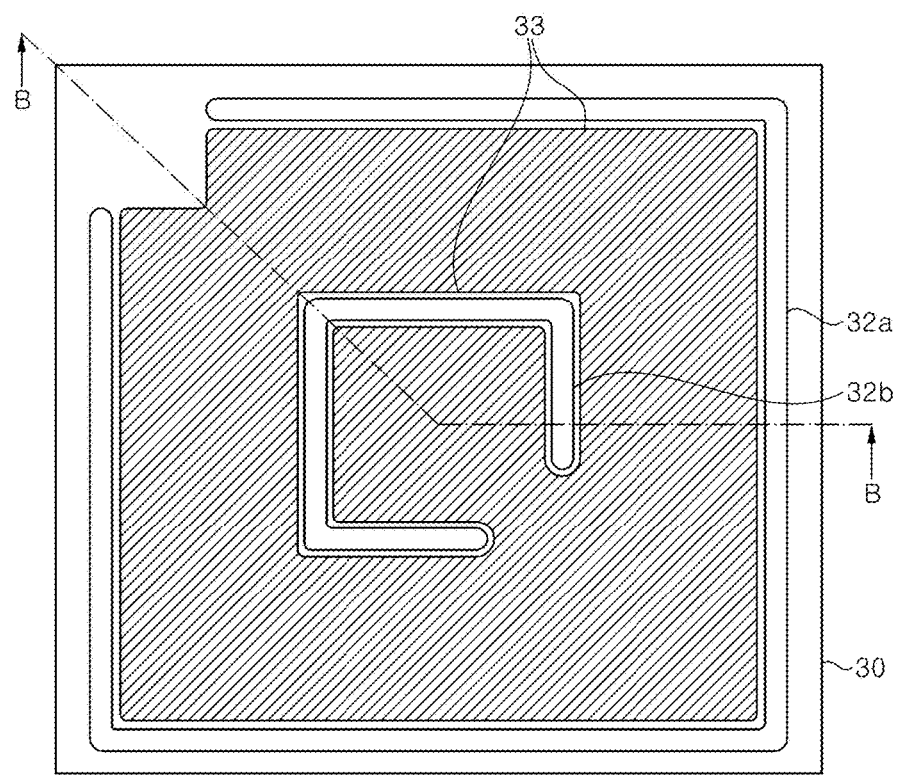
Figure 12B:
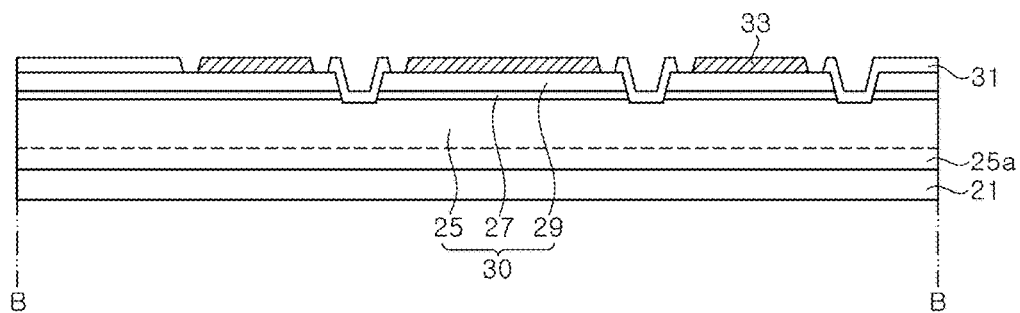

Referring to FIG. 12A and FIG. 12B, a first insulating layer 31 is formed to cover the semiconductor stack structure 30. The first insulating layer 31 covers the first and second grooves 32a, 32b. In addition, the first insulating layer 31 may also cover a portion of an upper surface of the second conductivity type semiconductor layer 29. The first insulating layer 31 covering the first groove 32a may extend outside the first groove 32a to cover the second conductivity type semiconductor layer 29. In addition, the first insulating layer 31 may extend from the first groove 32a to cover the second conductivity type semiconductor layer 29. Here, the first insulating layer 31 exposes most of the upper surface of the second conductivity type semiconductor layer 29. The first insulating layer 31 may be formed by deposition through chemical vapor deposition, sputtering or e-beam deposition, followed by patterning through photolithography and etching.

Then, an ohmic reflective layer 33 is formed on the second conductivity type semiconductor layer 29. The ohmic reflective layer 33 is formed on the second conductivity type semiconductor layer 29 inside the second groove 32b and the first groove 32a. However, the ohmic reflective layer 33 is not formed on the second conductivity type semiconductor layer 29 outside the first groove 32a and may not be formed on the region of the first insulating layer 31 in the open portion of the first groove 32a.

The ohmic reflective layer 33 may be deposited by electron beam evaporation and may be patterned by a lift-off process. A side surface of the ohmic reflective layer 33 may adjoin the first insulating layer 31 or may be separated from the first insulating layer 31, as shown in FIG. 12A.

Figure 13A:
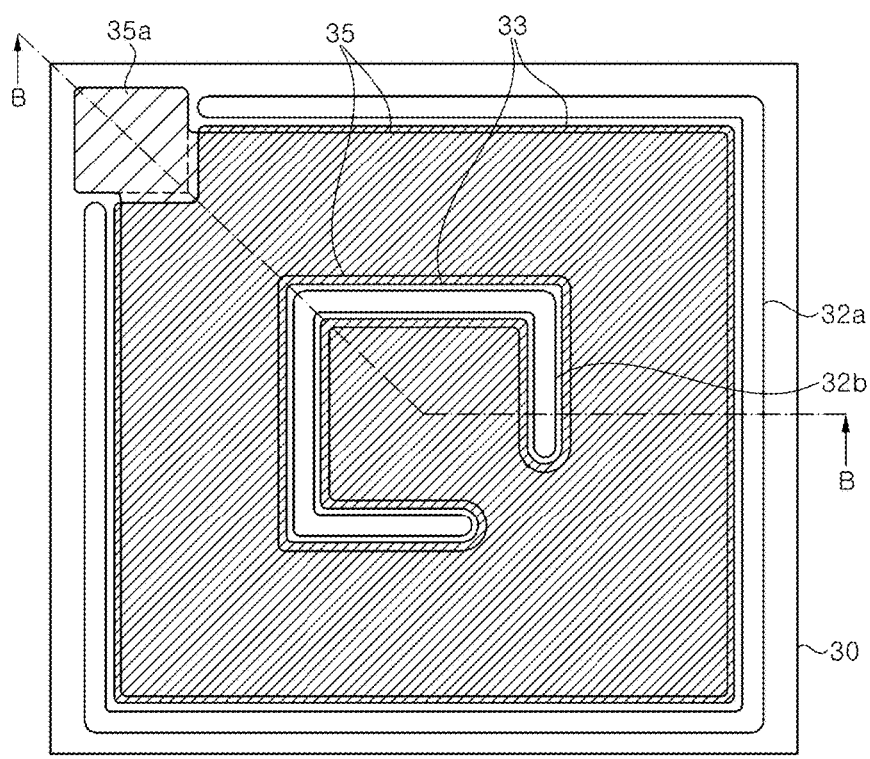
Figure 13B:
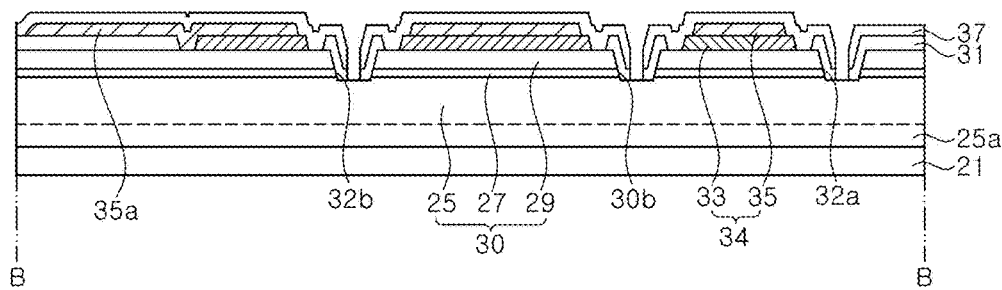

Thereafter, referring to FIG. 13A and FIG. 13B, a protective metal layer 35 is formed on the ohmic reflective layer 33. The protective metal layer 35 may cover an upper surface of the ohmic reflective layer 33 and the first insulating layer 31.

The protective metal layer 35 exposes the first insulating layer 31 disposed in the first and second grooves 32a, 32b. That is, the protective metal layer 35 has a through-groove having a shape similar to the first and second grooves 32a, 32b and the first insulating layer 31 in the first and second grooves 32a, 32b is exposed through the through-groove. On the other hand, the protective metal layer 35 may not be formed outside the first groove 32a.

Referring to FIG. 13A, an extension region 35a of the protective metal layer may further extend to an open region of the first groove 32a to cover the first insulating layer 31 having a flat shape. The extension region 35a of the protective metal layer covering the first insulating layer 31 may have a flat shape with a uniform thickness. That is, the extension region 35a of the protective metal layer covering the first insulating layer 31 may not have a step. The extension region 35a of the protective metal layer may be connected to an upper electrode pad 55.

A second insulating layer 37 is formed on the protective metal layer 35 and the extension region 35a thereof. The second insulating layer 37 covers upper and side surfaces of the protective metal layer 35 and the extension region 35a thereof. Accordingly, the second insulating layer 37 can prevent the protective metal layer 35 and the extension region 35a thereof from being exposed to the outside. Alternatively, the second insulating layer 37 may be formed to cover the upper surfaces of the protective metal layer 35 and the extension region 35a without covering the side surfaces thereof such that the side surfaces of the protective metal layer 35 and the extension region 35a can be exposed to the outside in a finished light emitting diode.

Referring to FIG. 13B, openings are formed to expose the first conductivity type semiconductor layer 25 in the first and second grooves 32a, 32b through photolithography and etching of the second insulating layer 37 and the first insulating layer 31. Bottom surfaces of these openings correspond to a first contact portion 39a and a second contact portion 39b described below.

Figure 14A:
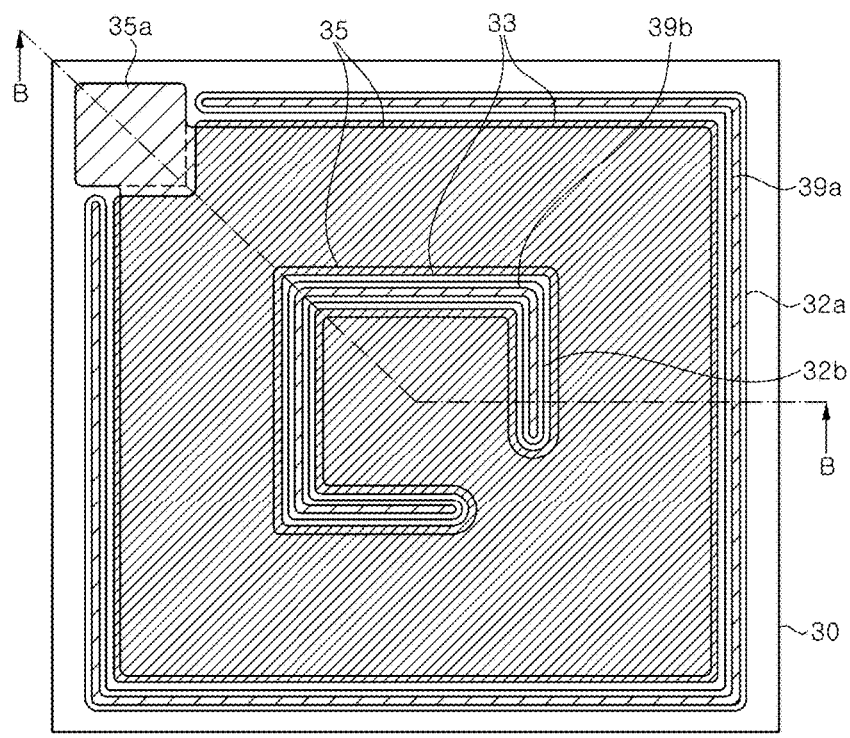
Figure 14B:
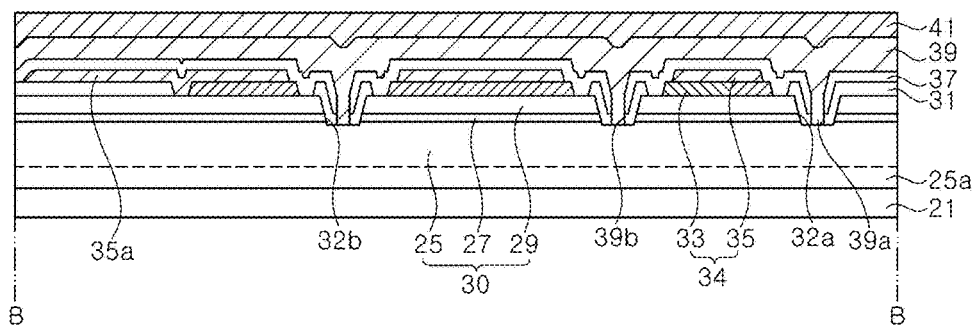
Figure 14C:
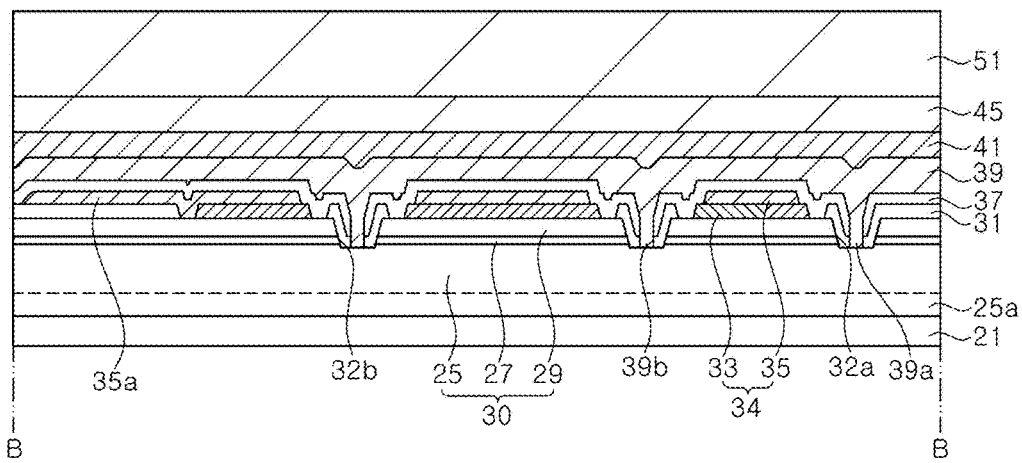

Referring to FIG. 14A, FIG. 14B and FIG. 14C a first electrode 39 is formed on the second insulating layer 37. The first electrode 39 covers the second insulating layer 37. The first electrode 39 includes the first contact portion 39a and the second contact portion 39b connected to the first conductivity type semiconductor layer 25 through the openings formed through the second insulating layer 37 and the first insulating layer 31. The first contact portion 39a is connected to the first conductivity type semiconductor layer 25 inside the first groove 32a and the second contact portion 39b is connected to the first conductivity type semiconductor layer 25 inside the second groove 32b.

As shown in FIG. 14A, like the first and second grooves 32a, 32b, each of the first contact portion 39a and the second contact portion 39b has an open portion such that the open portions are disposed at opposite sides to face each other. As a result, current can be evenly dispersed over a large area of the semiconductor stack structure 30. In particular, the open portion of the first contact portion 39a is placed near the extension region 35a of the protective metal layer and the open portion of the second contact portion 39b is placed at an opposite side thereto.

A first electrode-protection metal layer 41 is formed on the first electrode 39. The first electrode-protection metal layer 41 is formed to prevent metal elements such as Sn from diffusing into the first electrode 39 and may include Ti, Ni and Au. The first electrode-protection metal layer 41 may be omitted.

Then, as shown in FIG. 14C, a support substrate 51 is attached to the semiconductor stack structure. The support substrate 51 may be manufactured separately from the semiconductor stack structure 30 and then bonded to the first electrode 39 or the first electrode-protection metal layer 41 via a bonding metal layer 45. Alternatively, the support substrate 51 may be formed by plating the first electrode 39 or the first electrode-protection metal layer 41.

Figure 15:
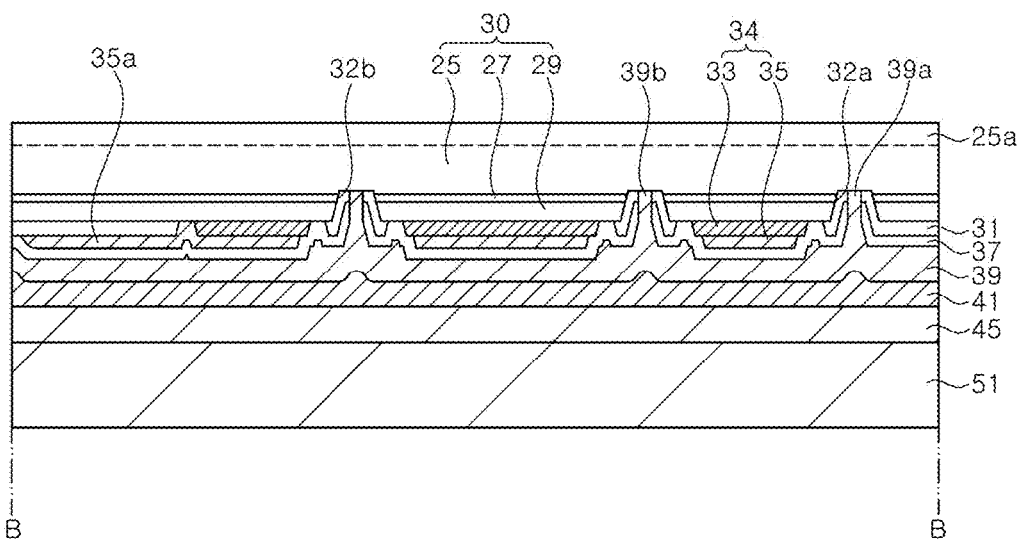

Referring to FIG. 15, the growth substrate 21 is removed to expose the surface of the first conductivity type semiconductor layer 25 of the semiconductor stack structure 30. Particularly, the undoped nitride semiconductor layer 25a may be exposed. The growth substrate 21 may be removed by, for example, a laser lift-off (LLO) process. After the growth substrate 21 is removed, the undoped nitride semiconductor layer 25a may be partially removed by etching in order to remove a region damaged by laser processing. Although the undoped nitride semiconductor layer 25a can be completely removed, at least part of the undoped nitride semiconductor layer 25a remains in this exemplary embodiment.

Figure 16A:
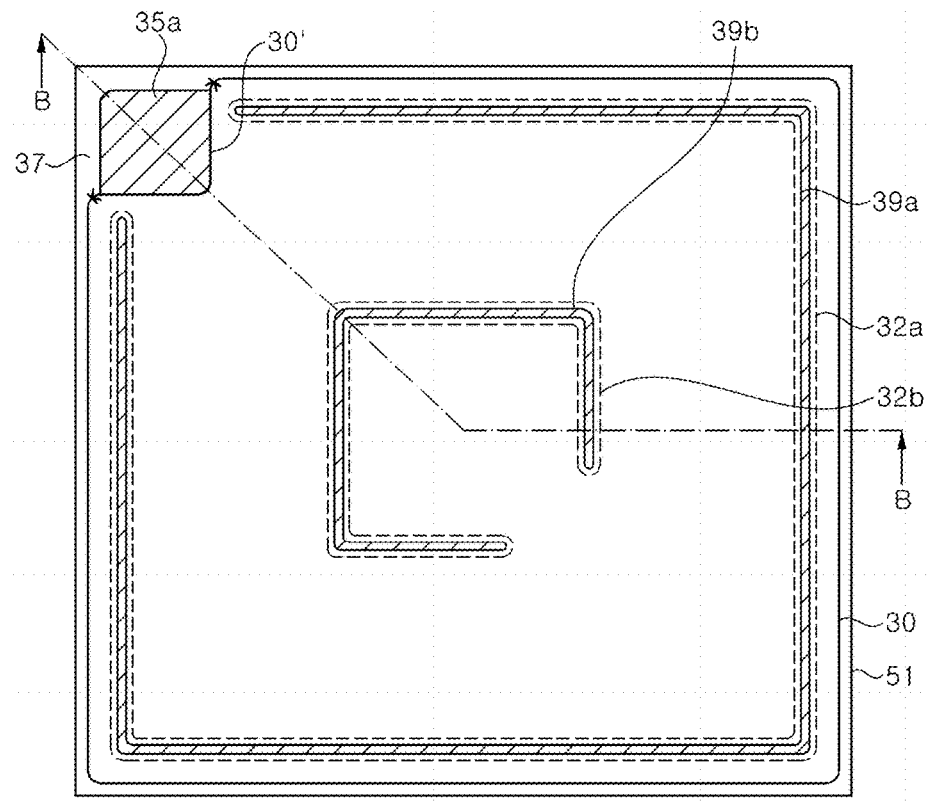
Figure 16B:
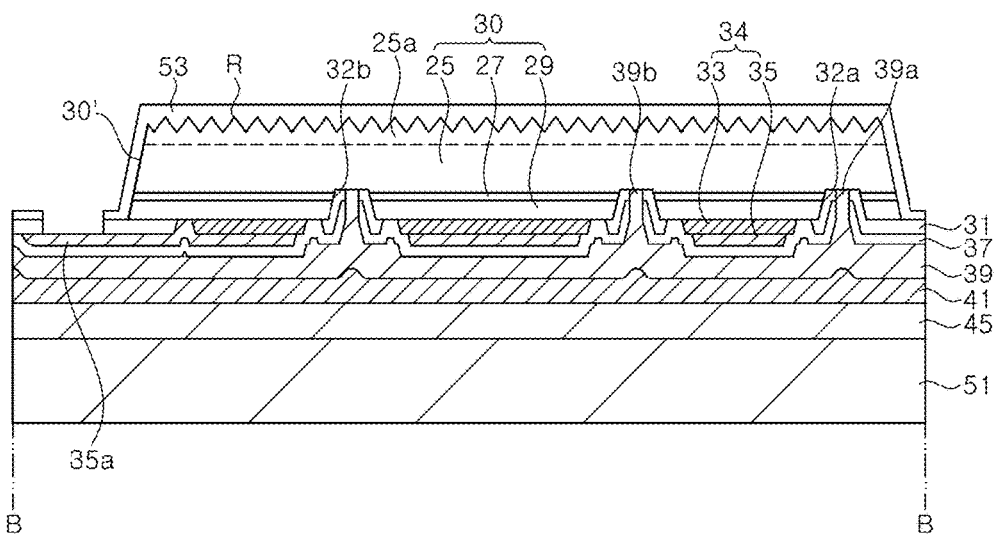

Referring to FIG. 16A and FIG. 16B, the semiconductor stack structure 30 on the support substrate 51 is divided into individual light emitting diodes (isolation process). The semiconductor stack structure 30 may be divided through photolithography and etching. Accordingly, the first insulating layer 31 on the support substrate 51 can be exposed. The semiconductor stack structure 30 may be divided in a rectangular shape. Here, an recess is formed near one corner of the semiconductor stack structure 30 by removing the semiconductor stack structure 30 through etching. Specifically, in the open region of the first groove 32a, the semiconductor stack structure 30 is removed to form the recess such that the first insulating layer 31 can be exposed on the inner side 30' of the recess.

Then, a roughened surface R is formed on the surface of the first conductivity type semiconductor layer 25. The roughened surface R may be formed by a technique such as photo-enhanced chemical etching. Here, since the edge of the semiconductor stack structure 30 does not have a mesa structure, the exposed region of the first insulating layer 31 and the region of the first insulating layer 31 disposed at the edge of the semiconductor stack structure 30 may continue in a flat shape. In particularly, at the inner side 30' of the recess, near which the upper electrode pad 55 will be disposed, there is no step between the region of the first insulating layer 31 disposed under the semiconductor stack structure 30 and the region of the first insulating layer 31 extending outward from the semiconductor stack structure 30 such that the first insulating layer 31 continues in a flat shape. This structure can secure a sufficient time for PEC etching. That is, if the first insulating layer 31 has a step between the region of the first insulating layer 31 exposed at the side surface of the semiconductor stack structure 30 and the region disposed at the edge of the semiconductor stack structure 30, the first insulating layer 31 can have poorer film quality than the first insulating layer 31 having a flat shape, and the second electrode 34 can also have poor film quality. Accordingly, when exposed to an acid PEC solution for a long period of time, the acid PEC solution can damage the protective metal layer 35 through the first insulating layer 31. According to the exemplary embodiments, since a sufficient time for PECT etching can be secured without damage to the protective metal layer 35, it is possible to increase surface roughness of the roughened surface. Further, since the undoped nitride semiconductor layer 25a remains, the thickness of the doped region in the first conductivity type semiconductor layer 25 can be kept relatively large, thereby assisting in current spreading.

Referring to FIG. 16B, an upper insulating layer 53 is formed on the first conductivity type semiconductor layer 25 on which the roughened surface R is formed. The upper insulating layer 53 may have a flat surface. Alternatively, the upper insulating layer 53 may be formed along the roughened surface R to have a rough surface corresponding to the roughened surface R. The upper insulating layer 53 also covers the side surface of the semiconductor stack structure 30 exposed by etching and the first insulating layer 31 exposed on the side surface of the semiconductor stack structure 30. In particular, the upper insulating layer 53 may cover the first insulating layer 31 extending outside the inner side 30' of the recess.

Thereafter, the upper insulating layer 53 and the first insulating layer 31 are partially removed to expose the extension region 35a of the protective metal layer. Thereafter, an upper electrode pad 55 (see FIG. 9) is formed to connect to the extension region 35a of the protective metal layer the semiconductor structure is divided into individual light emitting diodes along the isolation regions, thereby providing final light emitting diodes (see FIG. 9). Here, the first insulating layer 31, the second insulating layer 37, the first electrode 39, the first electrode-protection metal layer 41, the bonding metal layer 45 and the support substrate 51 may also be divided together, whereby the side surfaces thereof can be parallel to each other. On the other hand, the ohmic reflective layer 33 and the protective metal layer 35 are disposed in a region surrounded by the edges of the divided support substrate 51' and thus can be embedded in the light emitting diode without being exposed to the outside.

Figure 17A:
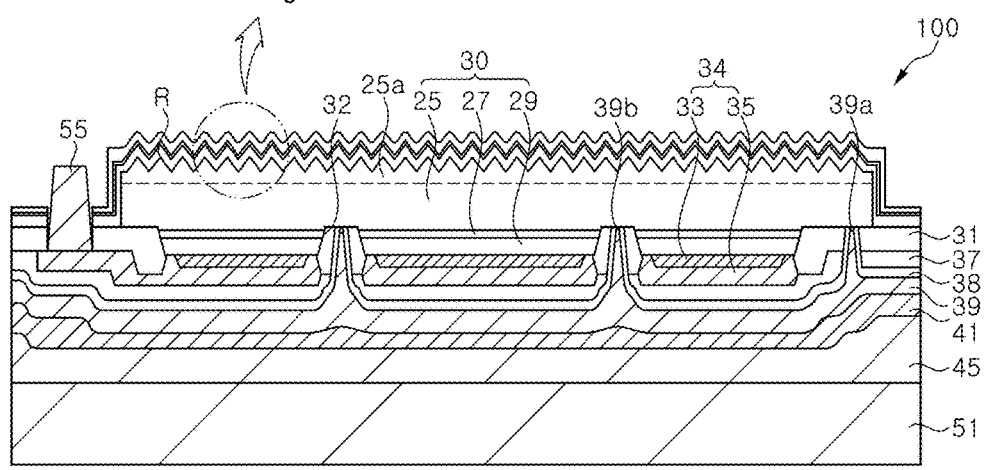
FIGS. 17A to FIG. 17D show schematic sectional views of a light emitting diode according to exemplary embodiments of the present disclosure.
Figure 17C:
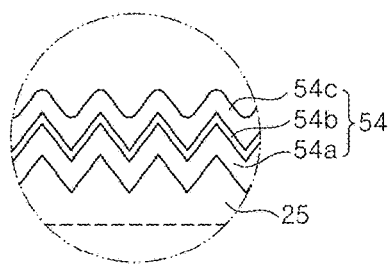
Figure 17B:
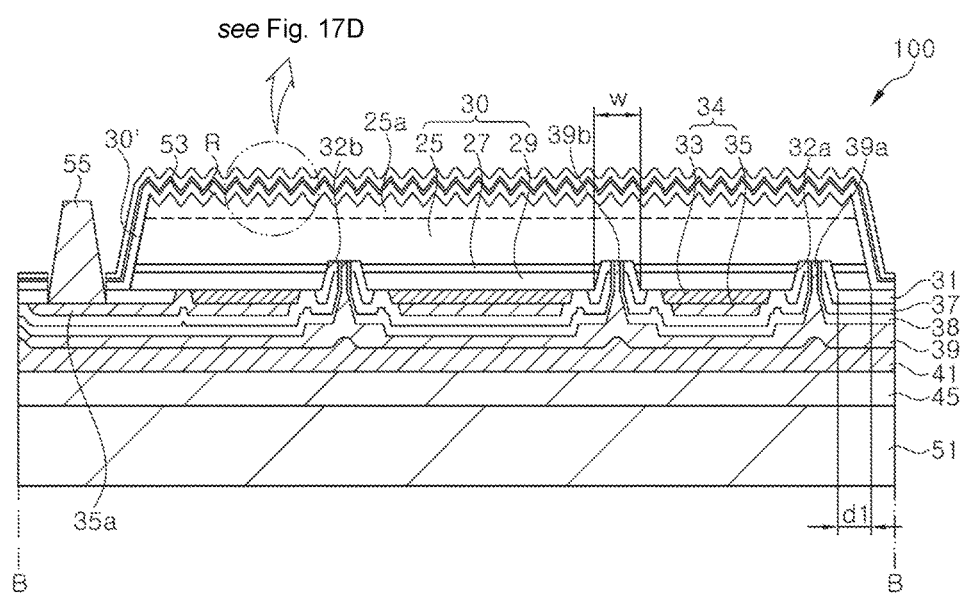

FIGS. 17A and 17B show schematic sectional views of a light emitting diode according to other exemplary embodiments of the present disclosure. Specifically, FIG. 17A to FIG. 17D show the light emitting diode further including a reflective layer and an upper coating layer unlike the light emitting diodes according to the above exemplary embodiments shown in FIG. 1 and FIG. 9. Detailed descriptions of the same components will be omitted and the following description will focus on the reflective layer and the upper coating layer.

First, referring to FIG. 17A to FIG. 17D, the light emitting diode according to the exemplary embodiments further includes a reflective layer 38 interposed between the second insulating layer 37 and the first electrode 39. The reflective layer 38 may include a dispersed Bragg reflector in which insulating layers having different indices of refraction are repeatedly stacked one above another. For example, the reflective layer 38 may include a dispersed Bragg reflector in which $SiO_2/TiO_2$ or $SiO_2/Nb_2O_5$ are repeatedly stacked one above another.

Referring to FIG. 17A and FIG. 17C, the reflective layer 38 can reflect light generated in the semiconductor stack structure 30 in the groove 32 and around the mesa, on which the ohmic reflective layer 33 is not disposed. Likewise, referring to FIG. 17B and FIG. 17D, the reflective layer 38 can reflect light generated in the semiconductor stack structure 30 in the first and second grooves 32a, 32b, on which the ohmic reflective layer 33 is not disposed. The reflective layer 38 can improve output of the light emitting diode. That is, the reflective layer 38 can block absorption of light by the first electrode 39, thereby improving the output of the light emitting diode.

Referring to FIG. 17A, the reflective layer 38 has openings exposing the first conductivity type semiconductor layer 25 around the mesa and in the groove 32 such that the first electrode 39 is connected to the first conductivity type semiconductor layer 25. Likewise, referring to FIG. 17B, the reflective layer 38 has openings exposing the first conductivity type semiconductor layer 25 in the first and second grooves 32a, 32b such that the first electrode 39 is connected to the first conductivity type semiconductor layer 25.

Next, the light emitting diode according to the exemplary embodiments may further include an upper coating layer 54 covering the upper and side surfaces of the first conductivity type semiconductor layer 25. The upper coating layer 54 covers the roughened surface R of the first conductivity type semiconductor layer 25 and may be formed along roughness of the roughened surface R.

Figure 17D:
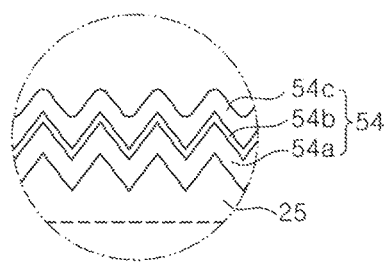

The upper coating layer 54 may have a stacked structure of plural layers. Referring to FIG. 17C and FIG. 17D that show enlarged circles of FIG. 17A and FIG. 17B, the upper coating layer 54 may include a first layer 54a covering the roughened surface R of the first conductivity type semiconductor layer 25, a second layer 54b covering the first layer 54a and including a different material than the first layer 54a, and a third layer 54c covering the second layer 54b and including a different material than the second layer 54b. Here, the first layer 54a and the third layer 54c may include the same material.

For example, according to one exemplary embodiment, the first layer 54a covering the roughened surface R of the first conductivity type semiconductor layer 25 may include $SiO_2$. In this exemplary embodiment, the first layer 54a may have the same structure as the upper insulating layer 53 of the light emitting diodes according to the exemplary embodiments shown in FIG. 1 and FIG. 9. The second layer 54b covering the first layer 54a may include $Al_2O_3$ and the third layer 54c covering the second layer 54b may include $SiO_2$. Here, the first layer 54a and the third layer 54c may have a larger thickness than the second layer 54b. For example, the thickness of each of the first layer 54a and the third layer 54c may be four to five times that of the second layer 54b.

An n-type nitride semiconductor layer (the first conductivity type semiconductor layer 25) has a refractive index of 2.4, $SiO_2$ has a refractive index of 1.54, and $Al_2O_3$ has a refractive index of 1.77. As such, the first conductivity type semiconductor layer 25 has a higher refractive index than the first layer 54a, whereby total reflection of light can occur at an interface between the first conductivity type semiconductor layer 25 and the first layer 54a.

In addition, the second layer 54b has a higher refractive index than the third layer 54c, whereby at least part of light traveling from the second layer 54b to the third layer 54c undergoes total reflection at the interface between the second layer 54b and the third layer 54c. On the other hand, light having undergone total reflection at the interface between the second layer 54b and the third layer 54c travels to an interface between the second layer 54b and the first layer 54a and at least partially undergoes total reflection at the interface between the second layer 54b and the first layer 54a. This is because the reflective index (1.77) of the second layer 54b is higher than the reflective index (1.54) of the first layer 54a. As such, since part of light traveling from the second layer 54b to the third layer 54c undergoes total reflection at the interface between the second layer 54b and the third layer 54c and part of light having undergone total reflection further undergoes total reflection at the interface between the second layer 54b and the first layer 54a, horizontal light spreading occurs in the second layer 54b.

That is, the first layer 54a may be interposed between the first conductivity type 6semiconductor layer 25 and the second layer 54b in order to achieve total reflection of light traveling from the second layer 54b to the interface between the second layer 54b and the first layer 54a. As the first layer 54a is disposed on the first conductivity type semiconductor layer 25, the light emitting diode has a structure wherein the sum of the refractive indices of the first conductivity type semiconductor layer 25 and the first layer 54a (for example, 2.4+1.54=3.94) is greater than the sum of the refractive indices of the second layer 54b and the third layer 54c (for example, 1.77+1.54=3.31), thereby enabling efficient light spreading and extraction.

Total reflection of light at the interface between the second layer 54b and the third layer 54c and additional total reflection of the light, which has undergone total reflection, at the interface between the second layer and the first layer can improve light uniformity of the light emitting diode according to the exemplary embodiments. Further, total reflection of light at the interface between the first conductivity type semiconductor layer and the first layer can also improve light uniformity of the light emitting diode according to the exemplary embodiments. Total reflection of light at the interfaces provides efficient light spreading in the horizontal direction, thereby improving uniformity of light emitted from the light emitting diode. In particular, in the light emitting diode shown in FIG. 17A, although the active layer 27 of the semiconductor stack structure 30 is removed in regions corresponding to the groove 32 and the side surface of the mesa by etching and light is not generated in these regions, uniformity of light can be improved through lateral light spreading by the upper coating layer 54. In the light emitting diode shown in FIG. 17B, although light is not generated in the regions in which the first and second grooves 32a, 32b are formed, uniformity of light can be improved through lateral light spreading by the upper coating layer 54.

Referring to FIG. 17A to FIG. 17D, the upper coating layer 54 is illustrated as being disposed not only on the upper and side surfaces of the first conductivity type semiconductor layer 25 but also on the first insulating layer 31 formed around the upper electrode pad 55. However, according to the exemplary embodiments, the upper coating layer 54 may be formed only on the upper surface of the first conductivity type semiconductor layer 25.

FIGS. 18A to 18D show schematic plan views of modifications of the first contact portion 39a of the light emitting diode according to the exemplary embodiments of the present disclosure.

As described with reference to FIG. 1 and FIG. 9, the first contact portion 39a may be disposed along the edge of the semiconductor stack structure 30 and have a single open region near the upper electrode pad 55, as shown in FIG. 18A. Alternatively, the first contact portion 39a may have bent portions near the open region, as shown in FIG. 18B. The bent portions are adjacent to the upper electrode pad 55 and bent inwards. The bent portions can assist in current spreading near the open region of the first contact portion 39a.

The first contact portion 39a may have a plurality of open regions. These open regions may be disposed at opposite sides to face each other, as shown in FIG. 18C, or may be disposed in plural locations, as shown in FIG. 18D. The open regions may have the same size or different sizes.

FIGS. 19A to 19E show schematic plan views of modifications of the second contact portion 39b of the light emitting diode according to the exemplary embodiments of the present disclosure.

The second contact portion 39b may have a square shape as described above, but it is not limited thereto. The second contact portion 39b may have various shapes which are partially open. For example, the second contact portion 39b may have a circular shape (a), a regular pentagonal shape (b), a regular hexagonal shape (c), a regular octagonal shape (d), or a square pentagonal shape (e).

Figure 20A:
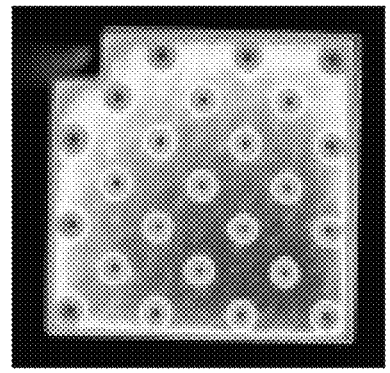
FIGS. 20A and 20B show images of luminous patterns of a typical via-hole type light emitting diode and a groove-type light emitting diode according to one exemplary embodiment of the present disclosure.
Figure 20B:
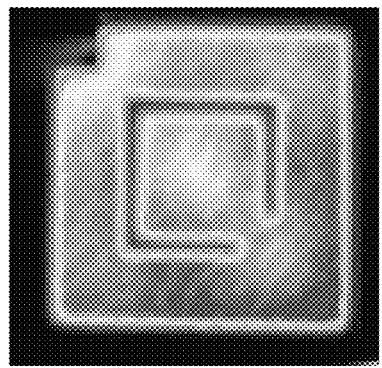

FIGS. 20A and 20B show images of luminous patterns of a typical via-hole type light emitting diode and a groove-type light emitting diode according to one exemplary embodiment of the present disclosure. These light emitting diodes have the same size.

Referring to FIG. 20A, in the typical via-hole type light emitting diode, the first electrode is connected to the first conductivity type semiconductor layer through a plurality of via-holes. Such a typical via-hole type light emitting diode exhibits a luminous pattern in which most light is generated in the central region thereof and a small amount of light is generated near the upper electrode pad and at the outer periphery of the light emitting diode, as shown in FIG. 20A.

The light emitting diode according to the exemplary embodiment has a uniform luminous pattern over a relatively large area, despite weak generation of light near the upper electrode pad, as shown in FIG. 20B.

Figure 21:
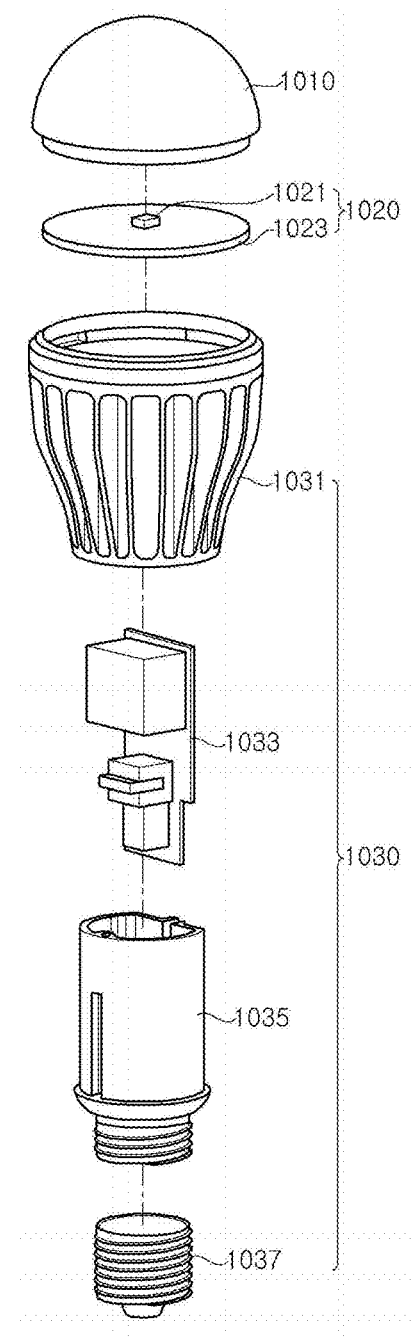
FIG. 21 is an exploded perspective view of a lighting apparatus to which a light emitting diode according to exemplary embodiments of the present disclosure is applied.

FIG. 21 is an exploded perspective view of a lighting apparatus to which a light emitting diode according to one exemplary embodiment is applied.

Referring to FIG. 21, the lighting apparatus according to this exemplary embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting device 1021 disposed on the substrate 1023. The light emitting module 1020 may be disposed at an upper portion of the body case 1031 and electrically connected to the power supply 1033.

As the substrate 1023, any substrate capable of supporting the light emitting device 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting device 1021 may include at least one of the light emitting diodes according to the exemplary embodiments described above.

The diffusive cover 1010 is disposed on the light emitting device 1021 and may be secured to the body case 1031 to cover the light emitting device 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 22:
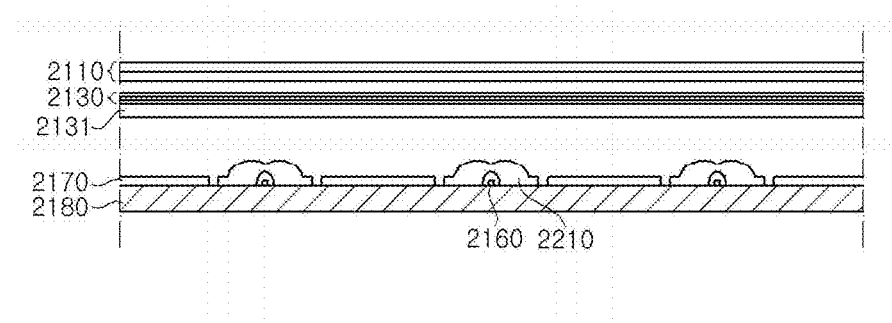
FIG. 22 is a cross-sectional view of one embodiment of a display apparatus to which a light emitting diode according to exemplary embodiments of the present disclosure is applied.

FIG. 22 is a cross-sectional view of one embodiment of a display apparatus to which a light emitting diode according to exemplary embodiments of the present disclosure is applied.

The display apparatus according to this exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting devices 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting devices 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting devices 2160 may include at least one of the light emitting diodes according to the exemplary embodiments described above. The light emitting devices 2160 may be regularly arranged in a predetermined pattern on the substrate. In addition, a lens 2210 may be disposed on each of the light emitting devices 2160 to improve uniformity of light emitted from the plurality of light emitting devices 2160.

The diffusive plate 2131 and the optical sheets 2130 are disposed above the light emitting device 2160. Light emitted from the light emitting devices 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this exemplary embodiment.

Figure 23:
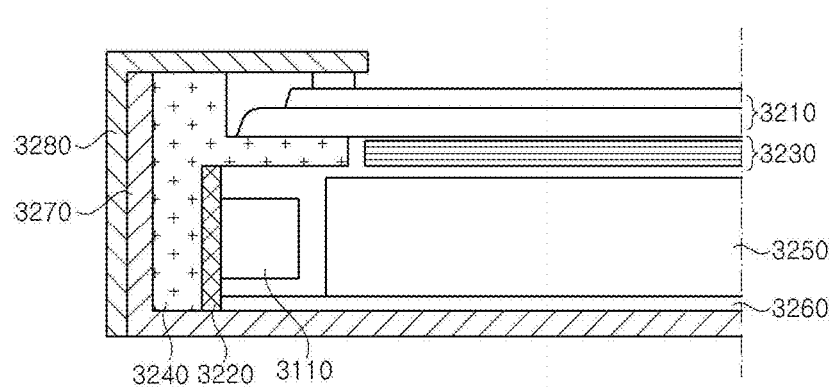
FIG. 23 is a cross-sectional view of another embodiment of a display apparatus to which a light emitting diode according to exemplary embodiments of the present disclosure is applied.

FIG. 23 is a cross-sectional view of another embodiment of the display apparatus to which a light emitting diode according to exemplary embodiments of the present disclosure is applied.

The display apparatus according to this exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting devices 3110 arranged at constant intervals on one surface of the substrate 3220. As the substrate 3220, any substrate capable of supporting the light emitting devices 3110 and being electrically connected thereto may be used without limitation. For example, the substrate 3220 may include a printed circuit board. The light emitting devices 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting devices 3110 into sheet light.

In this way, the light emitting diodes according to the exemplary embodiments may be applied to edge type displays like the display apparatus according to this exemplary embodiment.

Figure 24:
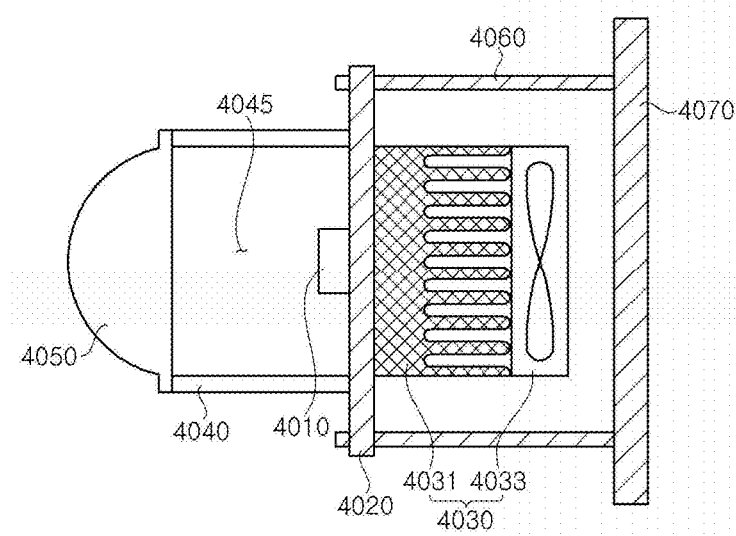
FIG. 24 is a cross-sectional view of a headlight to which a light emitting diode according to exemplary embodiments of the present disclosure is applied.

FIG. 24 is a cross-sectional view of a headlight to which a light emitting diode according to exemplary embodiments of the present disclosure is applied.

Referring to FIG. 24, the headlight according to this exemplary embodiment includes a lamp body 4070, a substrate 4020, a light emitting device 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting device 4010 may be used without limitation. For example, the substrate 4020 may include a substrate having a conductive pattern, such as a printed circuit board. The light emitting device 4010 is disposed on the substrate 4020 and may be supported and secured by the substrate 4020. In addition, the light emitting device 4010 may be electrically connected to an external power source through the conductive pattern of the substrate 4020. Further, the light emitting device 4010 may include at least one of the light emitting diodes according to the exemplary embodiments described above.

The cover lens 4050 is disposed on a path of light emitted from the light emitting device 4010. For example, as shown in the drawing, the cover lens 4050 may be separated from the light emitting device 4010 by the connection member 4040 and may be disposed in a direction of supplying light emitted from the light emitting device 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting device 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting device 4010.

In this way, the light emitting diodes according to the exemplary embodiments may be applied to headlights, particularly, headlights for vehicles, like the headlight according to this exemplary embodiment.

Although some exemplary embodiments have been described herein, it should be understood that these embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A light emitting diode comprising:
   a support substrate;
   a first conductivity type semiconductor layer disposed on the support substrate;
   a mesa comprising an active layer and a second conductivity type semiconductor layer, the mesa having a groove disposed under some region of the first conductivity type semiconductor layer, the mesa configured to expose an edge of the first conductivity type semiconductor layer, and the groove exposing the first conductivity type semiconductor layer through the second conductivity type semiconductor layer and the active layer;
   a first electrode disposed between the second conductivity type semiconductor layer and the support substrate and comprising a first contact portion electrically connected to the first conductivity type semiconductor layer around the mesa and a second contact portion electrically connected to the first conductivity type semiconductor layer through the groove;
   a second electrode disposed between the first electrode and the second conductivity type semiconductor layer and electrically connected to the second conductivity type semiconductor layer; and
   an upper electrode pad disposed adjacent to the first conductivity type semiconductor layer and connected to the second electrode,
   wherein the groove has a shape surrounding a region including a center of the mesa and partially open.

2. The light emitting diode according to claim 1, wherein the support substrate has a rectangular shape and the upper electrode pad is disposed above one corner of the support substrate.

3. The light emitting diode according to claim 2, wherein the first contact portion of the first electrode has a shape surrounding the mesa and at least partially open near the upper electrode pad.

4. The light emitting diode according to claim 3, wherein the first contact portion of the first electrode is connected to the first conductivity type semiconductor layer in plural linear regions separated from each other.

5. The light emitting diode according to claim 3, wherein an open portion of the groove is disposed closer to one of other corners of the support substrate than the one corner thereof, at which the upper electrode pad is disposed, so as not to face the upper electrode pad.

6. The light emitting diode according to claim 5, wherein the open portion of the groove is disposed at an opposite side of the upper electrode pad.

7. The light emitting diode according to claim 6, wherein the first contact portion has a single open portion.

8. The light emitting diode according to claim 3, wherein the first contact portion is connected in the same shape as the groove to the first conductivity type semiconductor layer.

9. The light emitting diode according to claim 1, wherein the groove has a partially open circular shape or a partially open convex polygonal shape.

10. The light emitting diode according to claim 9, wherein the groove has a partially open square shape.

11. The light emitting diode according to claim 1, further comprising:
    a first insulating layer insulating the first electrode from the first conductivity type semiconductor layer; and
    a second insulating layer interposed between the first electrode and the second electrode.

12. The light emitting diode according to claim 11, further comprising:
    a reflective layer disposed between the second insulating layer and the first electrode and comprising a dispersed Bragg reflector.

13. The light emitting diode according to claim 11, further comprising:
    a bonding metal layer interposed between the first electrode and the support substrate; and
    a first electrode-protection metal layer interposed between the bonding metal layer and the first electrode to cover the first electrode.

14. The light emitting diode according to claim 1, wherein the second electrode comprises an ohmic reflective layer forming ohmic contact with the second conductivity type semiconductor layer and a protective metal layer protecting the ohmic reflective layer.

15. The light emitting diode according to claim 14, wherein the protective metal layer extends outside the first conductivity type semiconductor layer and the upper electrode pad is connected to the protective metal layer.

16. The light emitting diode according to claim 15, further comprising:
  an upper insulating layer covering the first conductivity type semiconductor layer and connected to the protective metal layer through the upper insulating layer and the first insulating layer.

17. The light emitting diode according to claim 16, wherein an elevation of a plane in which the upper electrode pad adjoins the protective metal layer is placed between a plane of the first conductivity type semiconductor layer exposed around the mesa and a lower surface of the mesa adjoining the ohmic reflective layer.

18. The light emitting diode according to claim 1, further comprising:
  an upper coating layer disposed on the first conductivity type semiconductor layer and having a stacked structure of plural material layers.

19. The light emitting diode according to claim 18, wherein the upper coating layer comprises a first layer covering the first conductivity type semiconductor layer, a second layer covering the first layer and having a higher refractive index than the first layer, and a third layer covering the second layer and having a lower refractive index than the second layer.

20. The light emitting diode according to claim 19, wherein total reflection occurs at an interface between the second layer and the third layer.

21. The light emitting diode according to claim 19, wherein the first layer and the third layer comprise $SiO_2$ and the second layer comprises $Al_2O_3$.

\* \* \* \* \*